United States Patent
Kim et al.

(10) Patent No.: US 9,128,662 B2
(45) Date of Patent: Sep. 8, 2015

(54) SOLID STATE DRIVE MEMORY SYSTEM

(71) Applicant: NovaChips Canada Inc., Ottawa (CA)

(72) Inventors: Jin-Ki Kim, Ottawa (CA); Dae-Hee Yi, Seoul (KR)

(73) Assignee: NovaChips Canada Inc., Ottawa, Ontario (CA)

( * ) Notice: Subject to any disclaimer, the term of this patent is extended or adjusted under 35 U.S.C. 154(b) by 418 days.

(21) Appl. No.: 13/720,951

(22) Filed: Dec. 19, 2012

(65) Prior Publication Data
US 2013/0163175 A1   Jun. 27, 2013

Related U.S. Application Data

(60) Provisional application No. 61/580,134, filed on Dec. 23, 2011.

(51) Int. Cl.
*G06F 1/16* (2006.01)
*G06F 3/06* (2006.01)
*G11C 7/10* (2006.01)

(52) U.S. Cl.
CPC ............. *G06F 1/16* (2013.01); *G06F 1/1658* (2013.01); *G06F 3/0626* (2013.01); *G06F 3/0658* (2013.01); *G06F 3/0688* (2013.01); *G11C 7/1003* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,649,742 B2 * | 1/2010 | Ni et al. | | 361/752 |
| 7,944,703 B2 * | 5/2011 | Ni et al. | | 361/752 |
| 7,983,051 B2 * | 7/2011 | Lee et al. | | 361/736 |
| 2010/0049914 A1 * | 2/2010 | Goodwin | | 711/114 |
| 2010/0067278 A1 * | 3/2010 | Oh et al. | | 365/51 |
| 2010/0118482 A1 * | 5/2010 | Kim | | 361/679.32 |
| 2010/0296256 A1 * | 11/2010 | Gillingham et al. | | 361/729 |
| 2011/0167201 A1 | 7/2011 | Huang | | |
| 2013/0107443 A1 * | 5/2013 | Kim et al. | | 361/679.32 |

OTHER PUBLICATIONS

Extended European Search Report for EP Application No. 12859118.7, dated Jun. 30, 2015.

* cited by examiner

*Primary Examiner* — Lisa Lea Edmonds
(74) *Attorney, Agent, or Firm* — Shin Hung; Borden Ladner Gervais LLP

(57) ABSTRACT

A solid-state drive architecture and arrangement for standardized disk drive form factors, PCI type memory cards and general motherboard memory. The solid-state drive architecture is modular in that a main printed circuit board (PCB) of the memory system includes a host interface connector, a memory controller, and connectors. Each connector can removably receive a memory blade, where each memory blade includes a plurality of memory devices serially connected to each other via a serial interface. Each memory blade includes a physical serial interface for providing data and control signals to a first memory device in the serial chain and for receiving data and control signals from a last memory device in the serial chain. Each memory blade can be sized in length and width to accommodate any number of memory devices on either side thereof.

20 Claims, 24 Drawing Sheets (Ball-down top view)

| Pin # | Pin Name | | Pin Name | Pin # | |
|---|---|---|---|---|---|
| | | | | | |
| 1 | VSS | | RST# | 2 | |
| 3 | STI | | STO | 4 | |
| 5 | DSI | | DSO | 6 | |
| 7 | CSI | | CSO | 8 | |
| 9 | VSS | | VSS | 10 | |
| 11 | VREF/NC | | CE# | 12 | |
| 13 | D5 | | Q7 | 14 | |
| 15 | VCC | | VCC | 16 | |
| 17 | D7 | | Q5 | 18 | |
| 19 | VSS | | VSS | 20 | |
| 21 | D4 | | Q6 | 22 | |
| 23 | VCCQ | | VCCQ | 24 | |
| 25 | D6 | | Q4 | 26 | |
| 27 | VSS | | VSS | 28 | |
| 29 | D1 | | Q3 | 30 | |
| 31 | VCC | | VCC | 32 | |
| 33 | D3 | | Q1 | 34 | |
| 35 | VCCQ | | VCCQ | 36 | |
| 37 | D0 | | Q2 | 38 | |
| 39 | VSS | | VSS | 40 | |
| 41 | D2 | | Q0 | 42 | |
| 43 | VCC | | VCC | 44 | |
| 45 | CK# | | CKO | 46 | |
| 47 | CK | | CKO# | 48 | |
| 49 | VSS | | VSS | 50 | |

(Channel in — left side, rows 13–49; Channel out — right side, rows 14–50)

FIG. 9

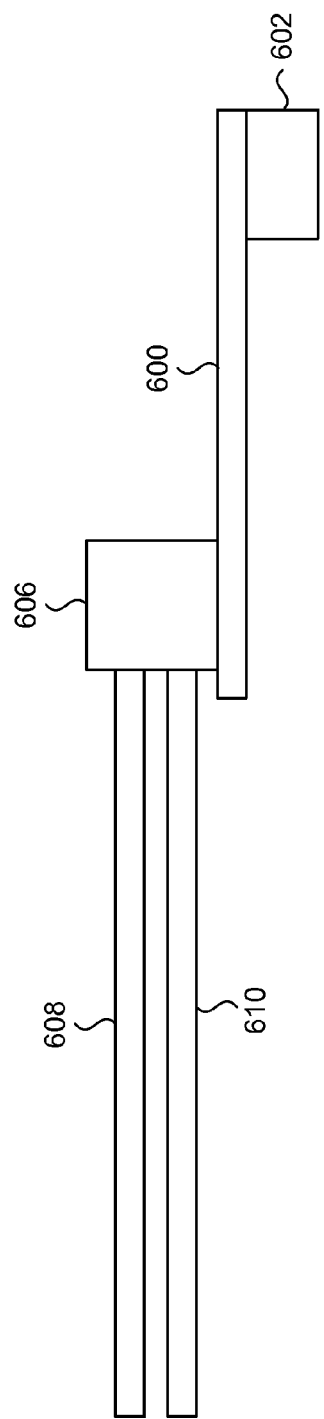
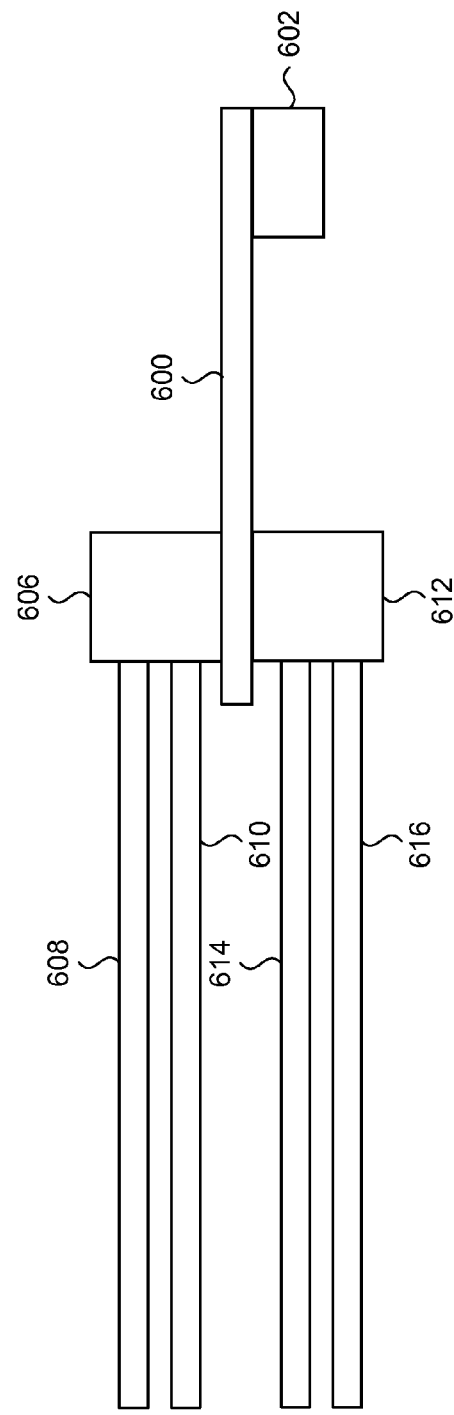

SOLID STATE DRIVE MEMORY SYSTEM

CROSS REFERENCE TO RELATED APPLICATIONS

This application claims the benefit of priority of U.S. Provisional Patent Application No. 61/580,134, filed on Dec. 23, 2011, the contents of which are incorporated herein by reference in their entirety.

FIELD

The present disclosure relates generally to memory systems. More particularly, the present disclosure relates to a mass storage memory system.

BACKGROUND

Flash memory is a commonly used type of non-volatile memory in widespread use as mass storage for consumer electronics, such as digital cameras and portable digital music players for example. Such flash memory may take the form of memory cards or USB type memory sticks, each having at least one memory device and a memory controller formed therein. Another mass storage application is solid state drives (SSD), which can be used as replacements for computer hard disk drives. These solid state drives can be used in computer workstations, networks, and for virtually any application in which large amounts of data need to be stored. Cloud computing is an application where user data is stored in a virtual location in the Internet, as opposed to locally in a workstation or other local area network (LAN). It should be appreciated that progressively increasing amounts of mass storage are required as more and more users adopt cloud computing for storing their data.

SSDs are becoming increasingly popular for personal computer and mass storage applications. Unlike traditional hard disk drives with spinning platters and moving magnetic read heads, SSDs have no moving parts. Hence SSDs are tolerant to physical vibrations. SSDs are capable of waking up quickly from a sleep mode in which minimum power is used by all the memory devices within. Traditional hard disk drives, on the other hand, require a relatively longer period of time to wake up from a sleep mode. There may be applications in which such long wake up times are not acceptable, and high speed performance is desired at all times. Therefore, the traditional hard disk drives must remain powered at all times, thereby consuming power even when no data accesses are being executed. Since the traditional hard disk drive is powered all the time, the probability of mechanical failure increases.

The disadvantage of current SSDs is the lower storage capacity for a given hard disk drive form factor. It should be understood that there is currently a 3.5 inch hard disk drive form factor typically used in computer workstations, and a 2.5 inch hard disk drive form factor typically used in laptop computers and other consumer devices where the smaller hard drive size is beneficial. Both form factors are industry adopted standards. Current 2.5 inch traditional hard disk drives can have a storage capacity of 750 GB, while in contrast, currently available 2.5 inch SSDs have a storage capacity of up to 256 GB. Such a storage capacity may not be sufficiently high for users who wish to store their multi-media collections locally. The advent of cloud computing has alleviated the need to store data and multi-media content locally on a computer or laptop. However, this data is typically stored in a data farm housing banks of traditional 3.5 inch hard disk drives. As previously discussed, all drives are kept active since users expect immediate access to their data at any time. As a consequence, significant power is required to keep all the drives running, which results in heating of the drives. Thus, large amounts of power are required to run air conditioners to cool the drives.

Although the 3.5 inch drive form factor is larger than the 2.5 inch drive form factor, the currently used SSD architecture is limited to a practical number of flash memory devices which can be used. While traditional 3.5 inch hard disk drives can be up to 4 TB by example, an SSD version would be limited to about 512 GB. Using lower storage capacity drives in a data farm is not cost effective for the storage space of the data farm.

It is, therefore, desirable to provide a solid-state drive architecture that can provide greater storage capacity for a given form factor or area than prior art solid-state drives currently provide.

It is, therefore, desirable to provide a solid-state drive architecture that can provide greater storage capacity for a given form factor or area than prior art solid-state drives currently provide, and with simplified motherboard design complexity.

SUMMARY

The present disclosure obviates or mitigates at least one disadvantage of previous SSD systems.

In a first aspect, the present disclosure provides a solid-state drive memory system. The solid-state drive memory system includes a memory controller, a memory blade and a connector. The memory controller has a host interface for providing and receiving host data, and a memory interface for providing memory input signals and receiving memory output signals. The memory blade has serially connected memory devices, and a connector tab having input ports configured to receive the memory input signals and output ports configured for providing the memory output signals. The memory input signals are received by a first memory device of the serially connected memory devices and the memory output signals are provided by a last memory device of the serially connected memory devices. The connector has a socket configured to releasably receive the connector tab of the memory blade and configured for coupling the memory input signals and the memory output signals between the memory blade and the memory controller.

In a present embodiment, the memory controller and the connector are mounted on a printed circuit board (PCB), where the connector is mounted approximately at an edge of the PCB and the memory blade extends away from the PCB when inserted into the socket of the connector. In this embodiment, the connector is a first connector mounted to a first side of the PCB, and a second connector is mounted to a second side of the PCB for receiving another memory blade. According to an aspect of this embodiment, the socket is a first socket and the connector includes a second socket configured to releasably receive another memory blade. In this aspect, the first socket can be serially connected to the second socket, and the memory input signals and the memory output signals form a channel of the memory controller. In yet another aspect of this embodiment, one set of the memory input signals and the memory output signals form a first channel of the memory controller, and a second set of the memory input signals and the memory output signals form a second channel of the memory controller, where the first socket is electrically connected to the first channel, and the second socket is electrically connected to the second channel.

According to another embodiment, a group of serially connected memory devices are permanently mounted to the PCB, wherein the PCB is sized to fit within a standardized hard disk drive housing. The connector is mounted on the PCB for positioning the received memory blade over at least one memory device of the group of serially connected memory devices.

In a further embodiment of the present aspect, the connector is a first connector, and a second connector is mounted in a side-by-side arrangement with the first connector and having respective sockets facing one direction. The PCB, the first connector and the second connector are dimensioned to fit within a standard hard disk drive housing. Alternatively, the connector is a first connector, and a second connector is mounted in a back-to-back arrangement with the first connector for receiving another memory blade.

According to alternative embodiments, the memory controller and the connector are mounted on a computer motherboard, or the memory controller and the connector are mounted on a PCI type card insertable into a PCI slot of a computer motherboard.

In a second aspect, the present disclosure provides a solid-state memory storage device. The solid-state memory storage device includes a main PCB, a memory controller, and at least one memory module. The main PCB includes a host interface connector for receiving input data having a host interface format and for providing output data having the host interface format. The memory controller is mounted to the main PCB for converting the input data into write data having a serial interface format, and for converting received read data having the serial interface format into the output data. The at least one memory module has serially connected memory devices mounted thereon, and releasably connectable to the main PCB for receiving the write data from the memory controller and for providing the read data to the memory controller.

According to an embodiment of the first aspect, the solid-state memory storage device further includes at least one memory module connector mounted to the main PCB shaped for receiving the at least one connector of the memory module. The main PCB and the at least one memory module are sized and shaped to fit within a hard disk drive housing, where the hard disk drive housing includes a standardized 3.5 inch hard disk drive housing or a standardized 2.5 inch hard disk drive housing.

Other aspects and features of the present disclosure will become apparent to those ordinarily skilled in the art upon review of the following description of specific embodiments in conjunction with the accompanying figures.

BRIEF DESCRIPTION OF THE DRAWINGS

Embodiments of the present disclosure will now be described, by way of example only, with reference to the attached Figures.

FIG. 9 is an example pin assignment for connectors of the memory blades of FIGS. 7 and 8, according to a present embodiment;

FIG. 18 is a side view of a single-sided partial sized main PCB of an SSD with dual stack connectors, according to a present embodiment;

FIG. 19 is a side view of a double-sided partial sized main PCB of an SSD with dual stack connectors, according to a present embodiment;

DETAILED DESCRIPTION

Generally, the present embodiments provide a solid-state drive architecture and arrangement for standardized disk drive form factors, PCI type memory cards and general motherboard memory. The solid-state drive architecture of the present embodiments is modular in that a main printed circuit board (PCB) of the memory system includes a host interface connector, a memory controller, and connectors. Each connector can removably receive a memory blade, where each memory blade includes a plurality of memory devices serially connected to each other via a serial interface. Each memory blade includes a physical serial interface for providing data and control signals to a first memory device in the serial chain and for receiving data and control signals from a last memory device in the serial chain. Each connector is connected to one serial channel of the memory controller, where the serial channel has no limit to the number of the memory devices which can be serially connected to it. The connectors can be placed proximate to the memory controller to minimize signal line length. Accordingly, each memory blade can be sized in length and width to accommodate a maximum number of memory devices on either side thereof.

Figure 1:
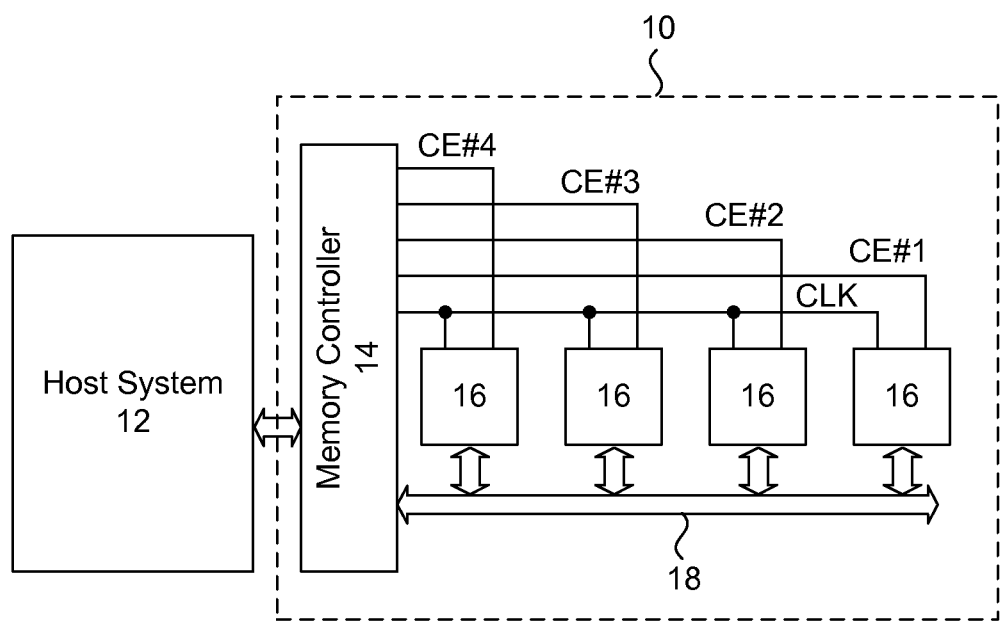
FIG. 1 is a block diagram of a prior art memory system.

A discussion of the current SSD architecture follows to facilitate an understanding of its limitations. FIG. 1 is a block diagram of a prior art flash memory system 10 integrated with a host system 12. Flash memory system 10 includes a memory controller 14 in communication with host system 12, and multiple non-volatile memory devices 16. The host system will include a processing device such as a microcontroller, microprocessor, or a computer system. The Flash memory system 10 of FIG. 1 is configured to include one channel 18, where memory devices 16 are connected in parallel to channel 18. Those skilled in the art will understand that the memory system 10 can have more or fewer than four memory devices connected to it.

Channel 18 includes a set of common buses, which include data and control lines that are connected to all its corresponding memory devices. Each memory device is enabled/disabled with respective chip select signals CE#1, CE#2, CE#3 and CE#4, provided by memory controller 14. The "#" indicates that the signal is an active low logic level signal. The memory controller 14 is responsible for issuing commands and data, via the channel 18, to a selected memory device based on the operation of the host system 12. Data read from the memory devices is transferred via the channel 18 back to the memory controller 14 and host system 12. Operation of flash memory system 10 is synchronized to a clock CLK, which is provided in parallel to each memory device 16. Flash memory system 10 is generally referred to as a multi-drop configuration, in which the memory devices 16 are connected in parallel with respect to channel 18.

In Flash memory system 10, non-volatile memory devices 16 can be identical to each other, and are typically implemented as NAND flash memory devices. Those skilled in the art will understand that flash memory is organized into banks, and each bank is organized into planes and each plane includes blocks to facilitate block erasure. Most commercially available NAND flash memory devices are configured to have two planes of memory.

There are specific issues that will adversely impact performance of the system 10. The configuration of Flash memory system 10 imposes physical performance limitations. With the large number of parallel signals extending across the system, the signal integrity of the signals they carry will be degraded by crosstalk, signal skew, and simultaneous switching noise (SSN). Power consumption in such a configuration becomes an issue as each signal track between the flash controller and flash memory devices is frequently charged and discharged for signaling. With increasing system clock frequencies, the power consumption will increase.

There is also a practical limit to the number of memory devices which can be connected in parallel to the channel, since the drive capability of a single memory device is small relative to the loading of the long signal tracks. Furthermore, as the number of memory devices increases, more chip enable signals (CE#) are required, and the clock signal CLK will need to be routed to the additional memory devices. Clock performance issues due to extensive clock distribution are well known in the art, and would need to be addressed. Therefore, in order to accommodate a memory system having a large number of memory devices, either a controller having more channels must be used, or the system will need to be clocked at a lower frequency. A controller configured to have multiple channels and additional chip enable signals increases the cost of the memory system. Otherwise, the memory system is limited to a small number of memory devices.

NAND flash memory devices, which are the most commonly used device type for non-volatile data storage applications, may eventually reach a maximum density per chip. Therefore, the multi-drop configured flash memory system of FIG. 1 can be limited in its maximum storage density since the channel 18 can only accommodate a limited number of memory devices.

For example, the channel 18 can be limited to receiving a maximum of 8 memory devices, otherwise loading effects through the addition of further memory devices can negatively impact the overall performance of the memory system 10. Therefore, the only way to increase the total memory capacity of memory system 10 would be to add more channels to memory controller 14. At the current time, memory controllers having up to 8 channels can be used for SSD applications. Accordingly, if each memory device can store 64 Gb of data, then the total memory capacity of a memory system 10 having 8 channels would be 512 GB. It should be noted that each memory device package can include multiple memory device dies, where the data signal lines of the dies are connected to each other in parallel to the pins of the package.

Figure 2:
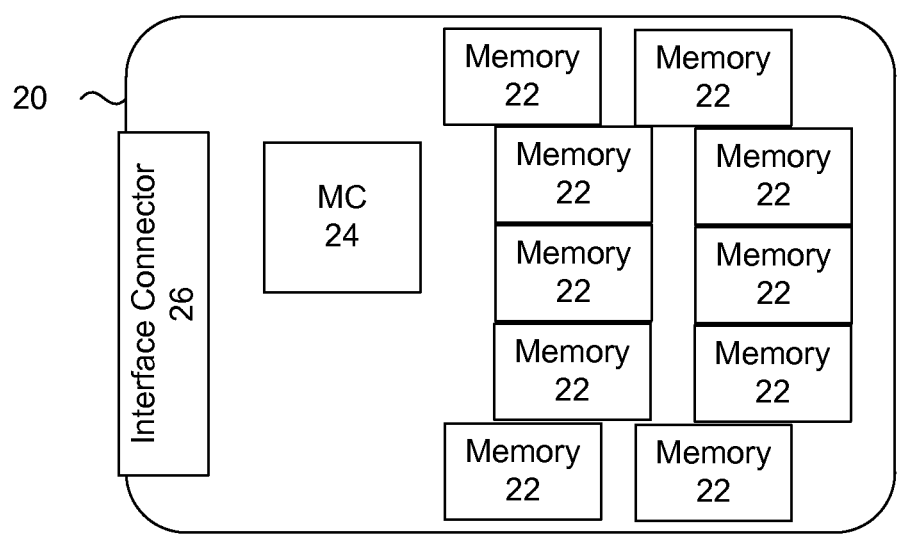
FIG. 2 is a diagram of a prior art 2.5 inch solid-state drive motherboard.

FIG. 2 shows a floor plan layout of a 2.5 inch solid-state drive motherboard currently available on the market. As any person skilled in the art would appreciate, 2.5 inch solid-state drives have a standardized form factor having a given length, width and height. The main components of the motherboard 20 include memory devices 22, and a memory controller 24 for interfacing the memory devices to the physical and logical SATA interface connector 26. Other passive components and buffer memory may be mounted to the motherboard 20, but are not shown in FIG. 2. As is obvious from the photographs of FIG. 2, the motherboard area is limited, which presents the following problems for 2.5 inch solid-state drive designers. Because each channel of the memory controller is limited to receiving a finite number of memory devices, more channels would need to be populated with memory devices in order to increase the overall memory capacity of the drive. However, because the space on the motherboard is limited, it may not be possible to add more memory devices. Another problem for the solid-state drive designers is layout complexity for routing sets of data and control signals for each memory device to a respective channel, which is connected to the memory controller. As previously mentioned, the sheer number of signal lines required will inherently limit overall performance, since adjacent signal lines can electrically interfere with each other.

Unfortunately, consumers demand greater storage capacity for solid-state drives, which are commonly used in laptop computers. Therefore, the example 2.5 inch solid-state drives shown in FIG. 2 may not meet the growing demand for higher storage capacity solid-state drives. While 3.5 inch solid-state drives have a larger form factor than their 2.5 inch counterparts, a similar limitation for total storage capacity will eventually be reached due to the same problems outlined above. Another solid-state memory solution for computer applications is PCI type cards which can be inserted into corresponding slots of a computer motherboard. Such PCI type cards typically include a large number of memory devices mounted thereon, with a limited set of memory devices connected in parallel to a dedicated memory controller. Each is considered a memory sub-system, and multiple sub-systems must be RAIDed together using high cost custom ASIC or FPGA memory controllers.

The main difference between such PCI type memory cards and the solid-state disk drives shown in FIG. 2 is that the PCI type memory card simply scales up the number of memory controllers mounted to the primary motherboard. Because additional memory controllers are used for each daughter board 38, a further additional memory controller is required for RAIDing them to the PCI interface. Ultimately, the area of such PCI memory cards is still finite, and the number of memory devices which can be connected in parallel to a single channel of a memory controller is still finite. Accordingly, the maximum storage capacity for a PCI type card is still limited, and the design complexity for routing sets of signals to respective channels of each memory device is high.

To resolve the problem of the prior art SSDs, a different memory system architecture is used. The previously described SSD memory systems can be referred to as a multi-drop or parallel memory system, since memory devices of a channel are connected in parallel with each other with respect to the data bus of the channel. The memory system used for the present SSD embodiments is based on a serial memory system architecture.

Figure 3:
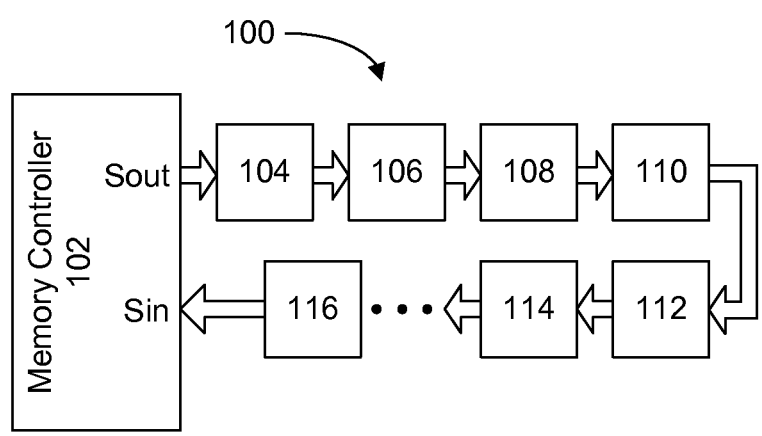
FIG. 3 is a general block diagram of a serial memory system, according to the present embodiments.

FIG. 3 is a block diagram illustrating the conceptual nature of a serial memory system architecture, according to one embodiment. In FIG. 3, the serial memory system 100 includes a memory controller 102 having at least one serial channel output port Sout and a serial channel input port Sin, and memory devices 104, 106, 108, 110, 112, 114 and 116 that are connected in series. In one embodiment, the memory devices can be flash memory devices. Alternatively, the memory devices can be DRAM, SRAM or any other type of memory device, provided they have a serial input/output interface compatible with a specific command structure, for executing commands or passing through commands and data to the next memory device. Further details of such memory device configuration and a specific command structure will be described later.

The current embodiment includes seven memory devices, but alternative embodiments can include as few as one memory device, and up to any number of memory devices. Accordingly, if memory device 104 is the first device of serial memory system 100 as it is connected to Sout, then memory device 116 is the Nth or last device as it is connected to Sin, where N is an integer number greater than zero. Memory devices 106 to 114 are then intervening serially connected memory devices between the first and last memory devices. Each memory device can assume a distinct identification number, or device address (DA) upon power up initialization of the system, so that they are individually addressable. Commonly owned U.S. Patent publication Nos. 2011/0087823, 2007/0233917, 2011/0032932, 2008/0192649, 2008/0215778 and 2008/0140899 describe methods for generating device addresses for serially connected memory devices of a memory system.

Memory devices 104 to 116 are considered serially connected because the data input of one memory device is connected to the data output of a previous memory device, thereby forming a series-connection configuration, with the exception of the first and last memory devices in the chain.

The serial memory system shown in FIG. 3 employs memory devices, such as flash memory devices, having compatible serial input/output interfaces. An example of a flash memory device having a serial input/output interface is described in commonly owned U.S. Pat. No. 7,652,922, filed on Dec. 30, 2005, the contents of which are incorporated by reference. In another example, an SIP (system in package) flash memory device having a serial input/output interface as described in commonly owned U.S. Pat. No. 7,957,173, the contents of which are incorporated by reference, can be used in the serial memory system shown in FIG. 3. A block diagram of an example memory device having a serial input/output interface is shown in FIG. 4.

Figure 4:
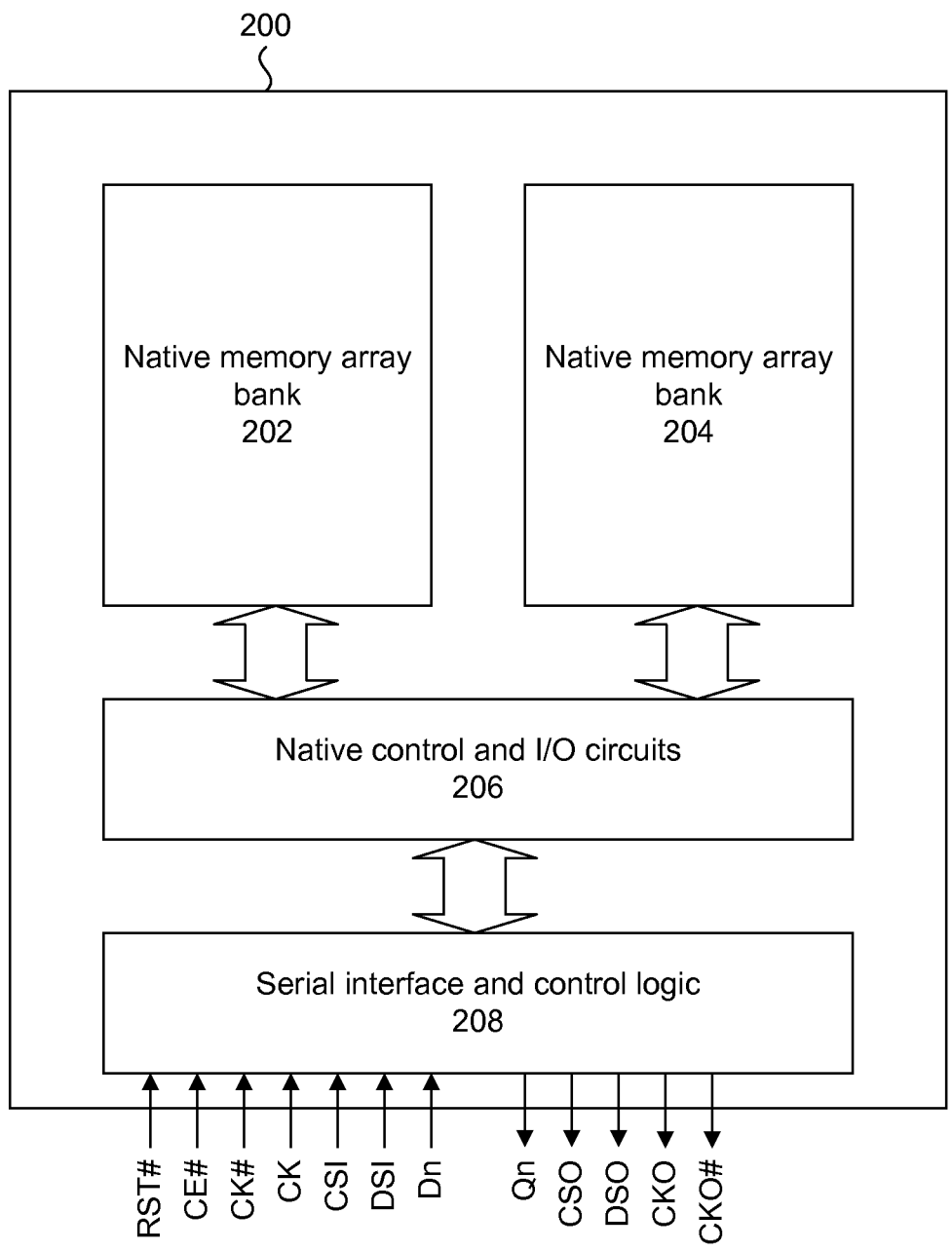
FIG. 4 is a block diagram of a generic memory device having a serial input/output interface, according to the present embodiments.

FIG. 4 is a block diagram illustrating the organization of a generic memory device having a serial input/output interface suitable for use in the serial memory system of the present embodiments. Memory device 200 includes a native memory core, which includes memory array banks 202 and 204, and control and I/O circuits 206 for accessing the memory array banks 202 and 204. Those skilled in the art will understand that the memory array can be organized as a single memory bank or more than two memory banks. The native memory core can be DRAM, SRAM, NAND flash, or NOR flash memory based, for example. Of course, any suitable emerging memory and its corresponding control circuits can be used. Accordingly, depending on the type of native memory core, circuit block 206 can include error correction logic, high voltage generators, refresh logic and any other circuit blocks that are required for executing the operations native to the memory type.

Typically, memory devices use command decoders for initializing the relevant circuits in response to a received command by asserting internal control signals. They may also include well known I/O circuitry for receiving and latching data, commands and addresses. According to the present embodiments, a serial interface and control logic block 208 is responsible for receiving data and control signals, and for outputting or providing data and control signals. In the present example, the serial interface and control logic block 208 receives RST#, CE#, CK#, CK, CSI, DSI and Dn inputs, and provides Qn, CSO, DSO, CKO and CKO# outputs. Table 1 below summarizes the functions of these signals.

TABLE 1

| Port | Description |
|---|---|
| CK/ CK# | Clock: CK is the system clock input. CK and CK# are differential clock inputs. All commands, addresses, input data and output data are referenced to the crossing edges of CK and CK# in both directions. |
| CE# | Chip Enable: When CE# is LOW, the device is enabled. Once the device starts a Program or Erase operation, the Chip Enable port can be de-asserted. In addition, CE# LOW activates and CE# HIGH deactivates the internal clock signals. |
| RST# | Chip Reset: RST# provides a reset for the device. When RST# is HIGH, the device is on the normal operating mode. When RST# is LOW, the device will enter the Reset mode. |
| D[n] | Data Input: (n = 0, 1, 2, 3, 4, 5, 6 or 7) receives command, address and input data. |

TABLE 1-continued

| Port | Description |
|---|---|
| Q[n] | Data Output: (n = 0, 1, 2, 3, 4, 5, 6 or 7) transmits output data during read operation. |
| CSI | Command Strobe Input: When CSI is HIGH, command, address and input data through D[n] are latched on the crossing of CK and CK#. When CSI is LOW, the device ignores input signals from D[n]. |
| CSO | Command Strobe Output: The echo signal CSO is a re-transmitted version of the source signal CSI. |
| DSI | Data Strobe Input: Enables the Q[n] buffer when HIGH. When DSI is LOW, the Q[n] buffer holds the previous data accessed. |
| DSO | Data Strobe Output: The echo signal DSO is a re-transmitted version of the source signal DSI. |
| CKO/ CKO# | Clock output: the echo clocks CKO/CKO# are re-transmitted version of the received clocks CK/CK#. |

The serial interface and control logic block 208 is responsible for various functions, some of which are discussed in U.S. Pat. No. 7,652,922. Example functions of serial interface and control logic block 208 include setting a device identifier number, passing data through to the next serially connected memory device, and decoding a received command for executing native operations. This circuit will be configured to receive commands serially, and will be configured to include additional commands specific to serial operation of the memory device, in addition to existing native commands specific for controlling core circuits. The command set can be expanded to execute features usable by the memory controller when the memory devices are serially connected. For example, status register information can be requested to assess the status of the memory device.

Accordingly, the memory devices shown in the embodiment of FIG. 3 can employ the flash memory devices disclosed in these previously mentioned patents and patent applications. The serial input/output interface described in these patent applications are examples of a serial interface format that can be used. Any serial input/output interface facilitating serial operation between memory devices can be used, provided it is configured for accepting a predetermined command structure.

The channel of memory controller 102 includes a data channel of any data width to carry command, data and address information, and a control channel to carry control signal data. The embodiment of FIG. 3 includes one channel, where one channel includes Sout and corresponding Sin ports. However, memory controller 102 can include any number of channels for accommodating separate memory device chains.

In general operation, the memory controller 102 issues a command through its Sout port, which includes an operational code (op code), a device address, address information for reading or programming, and data for programming. The command is issued as a serial bitstream packet, where the packet can be logically subdivided into predetermined size segments, such as bytes. A bitstream is a sequence or series of bits provided over time. The command is received by the first memory device 104, which compares the device address to its assigned address. If the addresses match, then memory device 104 executes the command. Otherwise, the command is passed through the output port of the memory device 104 to the next memory device 106, where the same procedure is repeated. Eventually, the memory device having the matching device address, referred to as the selected memory device, will receive and execute the operation dictated by the command. If the command is to read data, the selected memory device will output the read data through its output port, which is serially passed through intervening memory devices until it reaches the Sin port of the memory controller 102. The memory controller 102 has a serial interface compatible with the serial interface of the memory devices 104 to 116.

Figure 5:
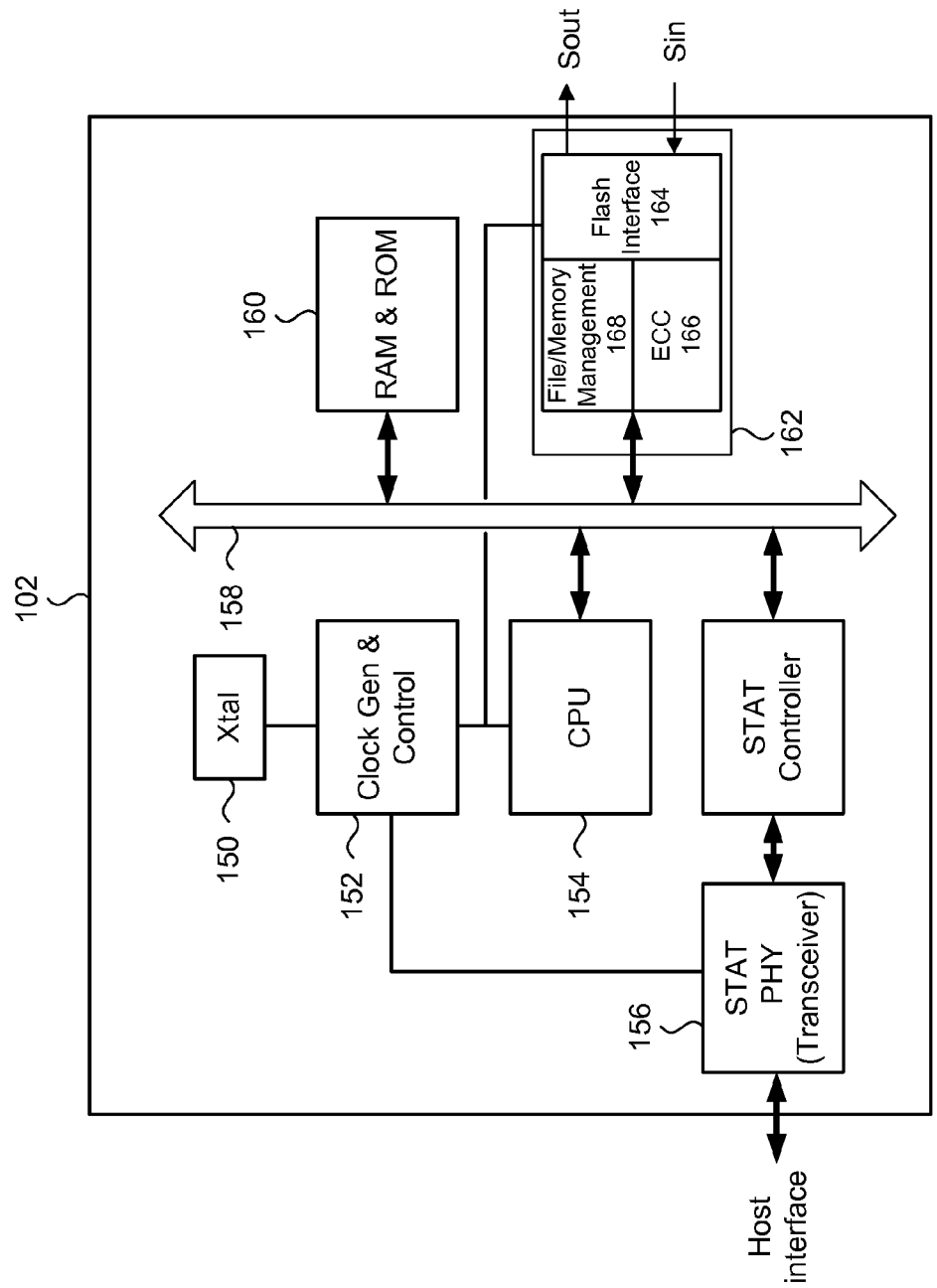
FIG. 5 is a block diagram of a solid state drive (SSD) controller.

FIG. 5 is a block diagram of a solid state drive (SSD) memory controller 102 connected to flash devices which can be used in the memory system 100 of FIG. 3. A crystal (Xtal) 150 provides a base clock signal which is connected to clock generator & control block 152. The Clock generator & control block 152 provides various clock signals to the central processing unit (CPU) 154, Flash controller and physical layer transceiver (Serial ATA PHY in this example) 156 for the Host Interface. The Host Interface is adapted for communication with an external host system, and can be configured as a serial ATA (SATA), eSTAT, ATA, CE-ATA, PCIe or a universal serial bus (USB) interface, for example. Custom interfaces or newly standardized interfaces can also be used. The CPU 154 communicates with other subsystems through a common bus 158. On chip random access memory (RAM) is used as buffer memory and read-only memory (ROM) stores executable codes. Both the RAM and ROM are shown in block 160. The flash control block 162 consists of a physical flash serial interface 164 for enabling communications with a memory device, an error correction (ECC) block 166 and a file & memory management block 168. In operation, flash memory devices are accessed through the physical flash serial interface 164, and accessed data from the flash devices are checked and corrected by the ECC block 166. The file & memory management block 168 provides logical-to physical address translation, and wear-leveling algorithms. With the exception of the flash serial interface 164, all the other components of the memory controller 102 are found in presently available memory controllers for the parallel memory system. Therefore, the parallel memory system memory controller design can be easily adapted for use in the serial memory system architecture embodiments simply by replacing the parallel interface with the flash serial interface 164 compatible for communicating with the memory devices of FIG. 3.

SSD controllers can be formed as an application-specific integrated circuit (ASIC) or field programmable gate array (FPGA) chip. According to the present embodiments, the SSD controller can be configured to have any number of channels, where each channel forms a closed loop signal path from an Sout port of the channel to an Sin port of the channel. Each Sout port provides a set of signals, including but not limited to data signals, clock signals and other control signals. Each Sin port receives this set of signals. As will be discussed later, memory devices connected to at least one memory module are positioned in line with this signal path, and more specifically connected in series with each other.

The previously shown block diagram of the serial memory device of FIG. 4 is formed as a semiconductor chip, and encapsulated in a package with package leads for connection to a printed circuit board. In order to maximize the total memory capacity of a memory device package, multiple semiconductor memory device chips can be packaged together. Within the package, these multiple memory device chips are serially connected with each other such that a first device has its Sin port terminals connected to the Sin port package leads, a last device has its Sout port terminals connected to the Sout package leads, and intervening memory device chips each have their Sin port terminals connected to the Sout port terminals of another memory device chip and their Sout port terminals connected to the Sin port terminals of another memory device chip. This is referred to as a multi-chip package (MCP).

Figure 6:
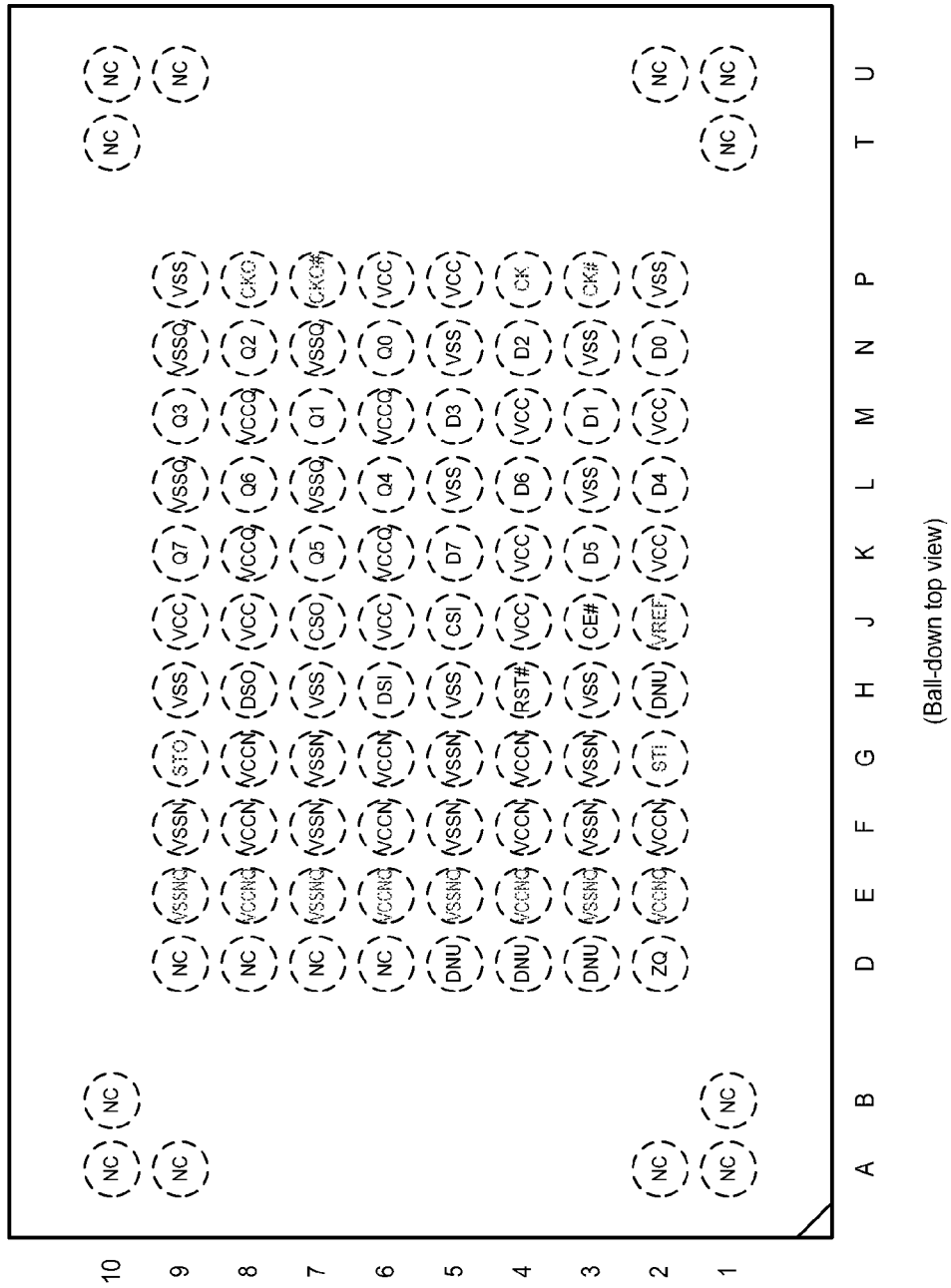
FIG. 6 is a schematic showing a ball grid array layout of a flash memory device package.

FIG. 6 is a diagram of a serial memory device package containing at least one semiconductor serial memory device chip. More specifically, FIG. 6 is a top down view of a package which encapsulates at least one serial memory device having a serial input/output interface. The dashed circles represent the positions of ball type connectors on the bottom side of the package, which are connected within the package to pads of the flash memory chip. FIG. 6 is one example of a ball grid array layout, and any alternative layout can be used. It is noted in this example that the package is rectangular in shape, having a long edge and a short edge. In the presently shown example embodiment of FIG. 6, each ball type connector is labeled with a signal name corresponding to the signal names shown in Table 1. In the present embodiments, the package leads of FIG. 6 are electrically connected to complementary connections on a PCB.

According to the present embodiments, multiple packages are connected to a memory blade, and interconnected with each other in a serial configuration. In the present embodiments, a memory blade is a PCB having memory devices mounted thereon without a memory controller.

Figure 7:
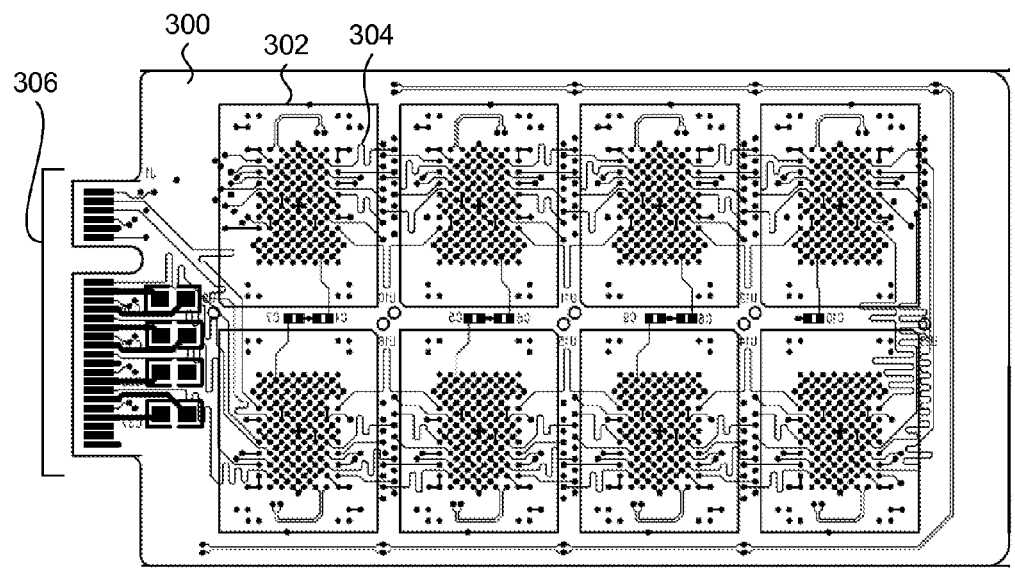
FIG. 7 is a diagram showing an example printed circuit board of a fat type memory blade, according to a present embodiment.
Figure 8:
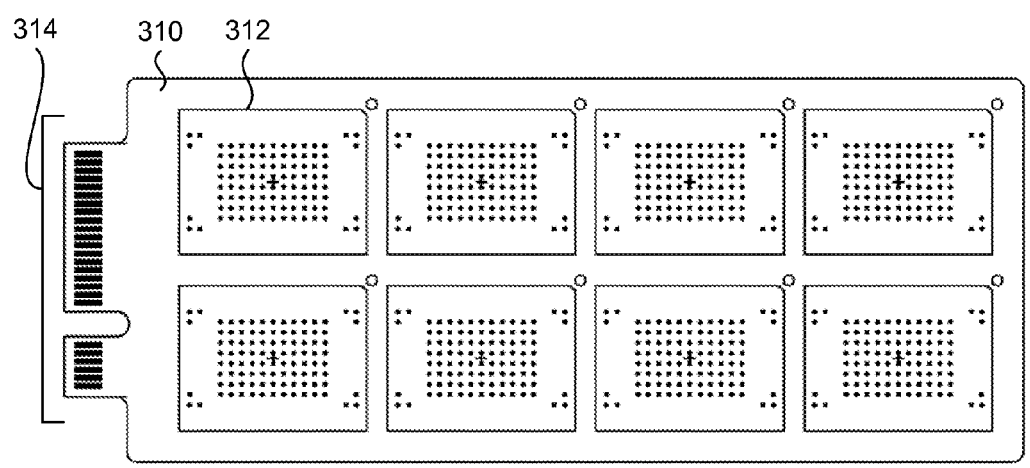
FIG. 8 is a diagram showing an example printed circuit board of a skinny type memory blade, according to a present embodiment.

FIG. 7 and FIG. 8 are diagrams of differently shaped memory blades shown without mounted memory devices, according to the present embodiments. FIG. 7 shows a fat type memory blade 300 which is shaped to receive eight flash memory device packages of the type shown in FIG. 6 on one side thereof. Eight more flash memory device packages can be attached to the other side of the fat type memory blade. The outline box 302 indicates the position where one memory device package is to be mounted to the PCB, which has the complementary connections to the ball connectors on the underside of the memory device package. The diagram of FIG. 7 shows the package ball signal diagram where connections between the ball connectors of the memory devices are electrically connected to traces of the PCB. The substrate of the fat type memory blade is a PCB having metal line traces for interconnecting the flash memory device packages serially with each other. According to the present embodiment, the signal traces are configured to connect each flash memory device serially with the others. An example line trace is line 304. It should be noted that the PCB can include several layers of line traces, thus not all signal connections are shown on the top layer of FIG. 7. A male type connector tab 306 extends from the left side of the fat type memory blade, and includes a set of conductor leads for receiving the input (Sin) and for providing the output (Sout) of the channel it is connected to. Both sides of the connector tab can include a set of conductor leads, where one can be the input set of conductor leads and the other can be the output set of conductor leads. The connector tab 306 is removably insertable into a complementary socket (not shown) of a memory blade connector. As can be seen in FIG. 7, the dimensions of the memory blade are determined by the orientation of the flash memory device package, in which the long edges are parallel to the vertical edges of the memory blade.

The memory blade embodiment of FIG. 8, referred to as a skinny type memory blade 310, is also shaped to receive eight flash memory device packages on one side thereof, and another eight flash memory device packages on the opposite side thereof. An outline box 312 shows the position where one memory device package is to be mounted to the PCB, but conductive line traces are not shown. A connector tab 314 extends from the left side of the skinny type memory blade, and includes a set of conductor leads for continuing either the input or the output of the channel it is connected to. Both sides of the connector tab can include a set of conductor leads, where one can be the input set of conductor leads and the other can be the output set of conductor leads. The skinny type memory blade is functionally identical to the fat type memory blade of FIG. 7, except that the form factor differs. More specifically, the short edges of the flash memory device packages are oriented to be parallel to the vertical edges of the memory blade.

The connector tabs 306 and 304 can be shaped the same, and have the same pin or lead configurations for carrying signals provided to and received from the mounted memory device packages. FIG. 9 is a table listing the pin assignments of the connector tab for either the fat type memory blade or the skinny type memory blade shown in FIGS. 7 and 8. In this example, the pins appearing on the left side of the table are part of the channel input for receiving signals while the pins appearing on the right side of the table are part of the channel output for providing or outputting signals. In this particular example, all the channel input pins are formed on one side of the connector tab, while all the channel output pins are formed on the other side of the connector tab. Alternatively, the channel input and output pins can be mixed on either side of the connector tab, or formed only on one side of the connector tab.

It can be seen that the memory packages, once mounted to the memory blades of either FIG. 7 or FIG. 8, are closely spaced either to each other or to the connector tab. An advantage of this configuration is that conductive line traces between adjacent memory packages or between the connector tab and a memory package can be minimized, in order to minimize signal line capacitance between packages. For example, a first memory package has its Sin port input terminals connected to the Sin pins of the memory blade, a last memory package has its Sout port output terminals connected to the Sout pins of the memory blade, and intervening memory packages are arranged serially between the first and last memory packages. The directional flow of information through the memory packages in this configuration is shown in FIG. 10.

It should be noted that the previously shown embodiments of the memory blades do not include a memory controller. Accordingly, the memory blade embodiments are memory controller free.

The memory blades of FIGS. 7 and 8 can be single channel or multi-channel memory blades. FIG. 10 is a functional block diagram of a single channel memory blade, having multiple memory packages mounted to a PCB and serially connected with each other between the Sin port terminals and the Sout port terminals of the memory blade.

Figure 10:
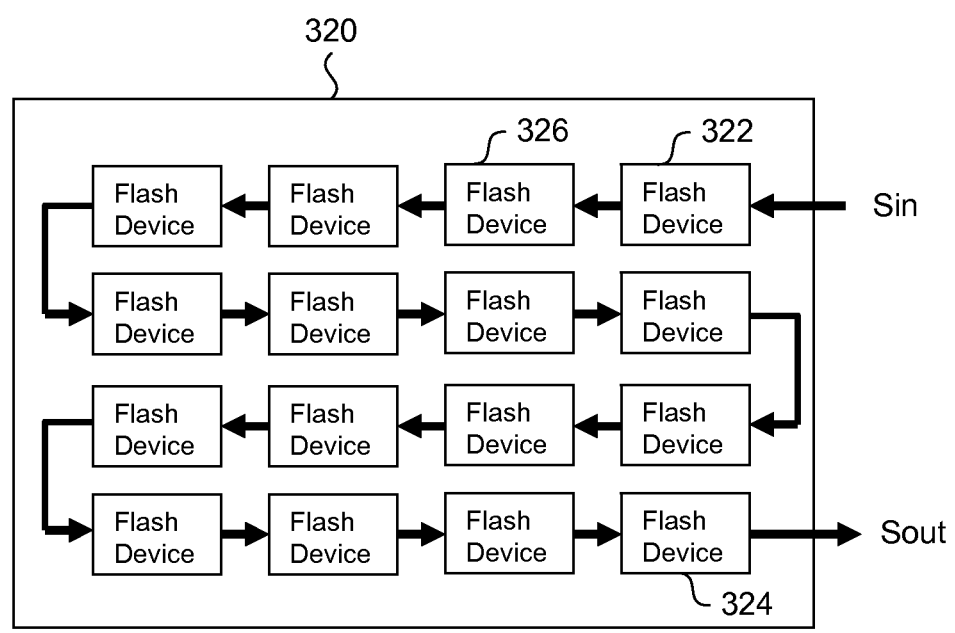
FIG. 10 is a block diagram of a single channel memory blade, according to a present embodiment.

In FIG. 10, the memory blade PCB 320 includes a first memory package 322, a last memory package 324, and intermediate memory packages 326. The first memory package 322 has its Sin port input terminals connected to the Sin input terminals of the memory blade, labelled in FIG. 10 as "Sin".

The last memory package 324 has its Sout port output terminals connected to the Sout output terminals of the memory blade, labelled in FIG. 10 as "Sout". Each of the intervening memory packages 326 is connected to two adjacent memory packages. The arrows between the memory packages illustrate the direction of command and data flow from the Sin port input terminals to the Sout output terminals of PCB 320. All the memory packages on PCB 320 are part of a single channel.

Figure 11:
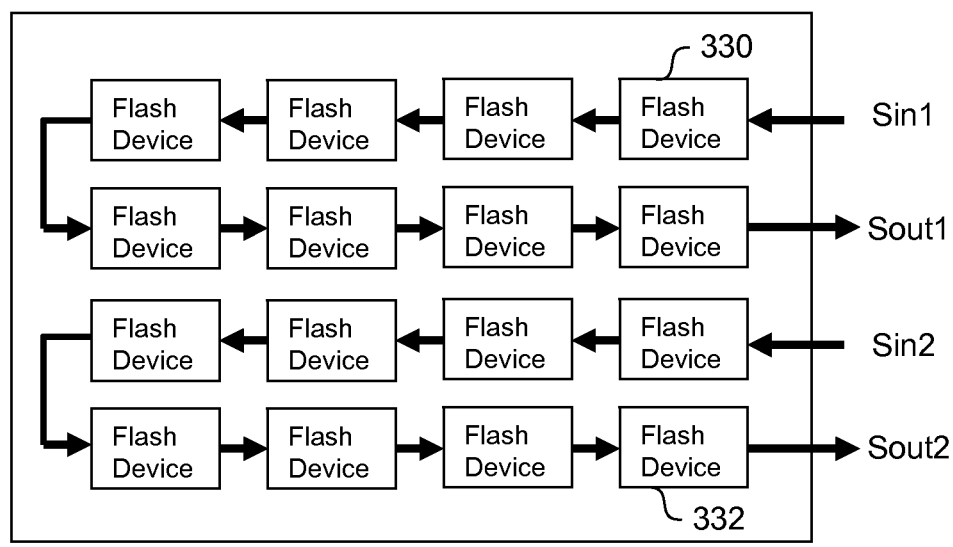
FIG. 11 is a block diagram of a multiple channel memory blade, according to a present embodiment.

FIG. 11 is a block diagram of a multiple channel memory blade, according to a present embodiment. More specifically, the embodiment of FIG. 11 is a two channel memory blade. As shown in FIG. 11, there are a total of 16 memory package devices divided into two different groups of memory devices which are serially connected to each other. In the present example, the first group includes eight serially connected memory packages 330 and the second group includes another eight serially connected memory packages 332. The first group of serially connected memory packages 330 are part of one channel, and are serially connected between the input terminals of Sin1 and the output terminals of Sout1. The second group of serially connected memory packages 332 are part of one channel, and are serially connected between the input terminals of Sin2 and the output terminals of Sout2. Although the present example shows memory packages grouped to form two different channels, different configurations can have more than two groups of memory packages each corresponding to a respective channel. For such an embodiment, the physical connector of the memory blade would have the necessary number of pins to accommodate the data and control signals for the multiple channels.

The memory blade embodiments shown in FIG. 10 and FIG. 11 are examples of possible arrangements of memory packages on a PCB that form a particular signal path route between the input terminals and the output terminals of a channel. Any arrangement of the memory packages on the PCB is possible. As previously mentioned, both sides of the PCB can have memory packages mounted thereon, therefore the signal path route can pass from a memory package on one side of the PCB to a memory package on the opposite side of the PCB. All the memory blades shown in the previous embodiments can be inserted into a complementary shaped socket for a corresponding channel or channels via their connector tabs. Further details of such sockets are described later.

Following are block diagrams showing different SSD memory system configurations, according to the present embodiments.

Figure 12:
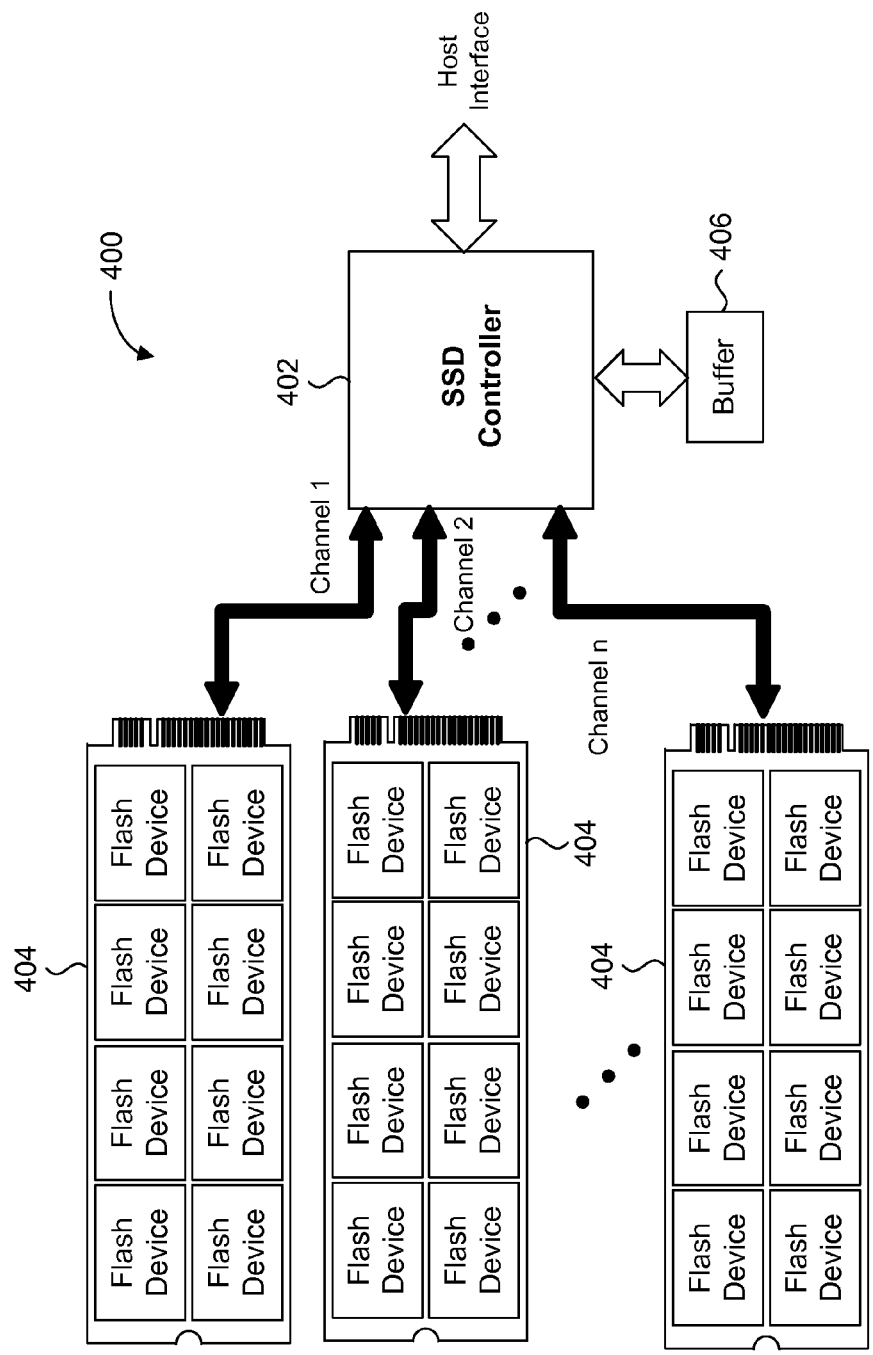
FIG. 12 is a block diagram of an SSD memory system having a single memory blade per channel, according to a present embodiment.

FIG. 12 is a block diagram of an SSD memory system having a single skinny type memory blade per channel, according to a present embodiment. In particular, the SSD memory system 400 of FIG. 12 has a memory controller 402 configured to have up to n channels, and each channel is connected to a single channel memory blade 404, which may be similar to the memory blade 310 shown in FIG. 8. In the presently shown embodiment, each channel is depicted with a bidirectional line, representing the presence of both Sout and Sin lines for the channel. Alternatively, memory blades having any shape can be used for accommodating specific area or form factor limitations, as will be described later. Buffer memory 406, such as SDRAM memory for example, is connected to the memory controller 402 for temporary storage of data read from the memory blades 404, or temporary storage of write data to be provided to the memory blades 404, of any channel. The memory controller 402 can include any type of host interface, such as PCIe, SATA, USB or Thunderbolt interfaces, for communicating data to or from the host device.

Figure 13:
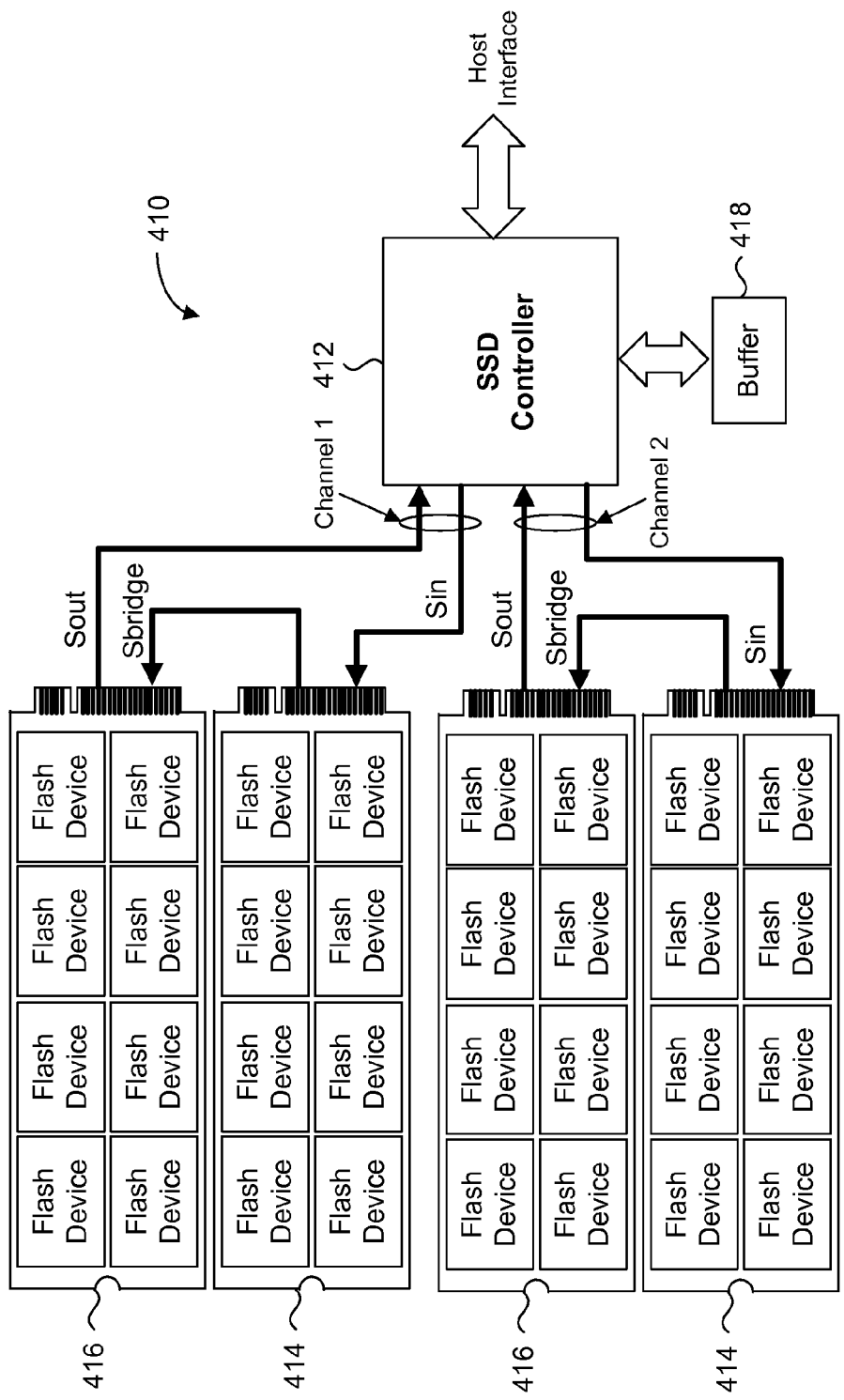
FIG. 13 is a block diagram of an SSD memory system having multiple memory blades per channel, according to a present embodiment.

FIG. 13 is a block diagram of an SSD memory system having multiple skinny type memory blades per channel, according to a present embodiment. In particular, the SSD memory system 410 of FIG. 13 has a memory controller 412 configured to have a number of channels, two of which are shown in the present example, where the memory controller 412 can be the same as memory controller 402 used in the embodiment of FIG. 12. In this alternative embodiment each channel is connected to a pair of single channel memory blades 414 and 416, where each memory blade is similar to the memory blade 310 shown in FIG. 8 by example. Buffer memory 418, such as SDRAM memory for example, is connected to the memory controller 412 for temporary storage of data to or from the memory blades 414 and 416 of any channel. The memory controller 412 can include any type of host interface, such as but not limited to, PCIe, SATA, USB or Thunderbolt interfaces, for communicating data to or from the host device.

In the presently shown embodiment, each channel is depicted with three lines. First is an Sin line, second is an Sout line, and third is an Sbridge line. More specifically, the Sin line is connected to the Sin input terminals of memory blade 414 while the Sout line is connected to the Sout output terminals of memory blade 416. Therefore the Sin line carries all the signals of the Sin input terminals while the Sout line carries all the signals of the Sout output terminals. The Sbridge line connects the Sout output terminals of memory blade 414 to the Sin input terminals of memory blade 416, thereby continuing the channel and data path route from memory blade 414 to 416. Accordingly, the pair of memory blades 414 and 416 are serially connected with each other. Functionally, the two serially connected single channel memory blades 414 and 416 form the equivalent of a single memory blade having the aggregate number of memory devices of both memory blades connected serially together. It should be noted that any number of memory blades can be serially connected with each other for each channel, simply by bridging the Sout output terminals of one memory blade to the Sin input terminals of another memory blade.

Figure 14:
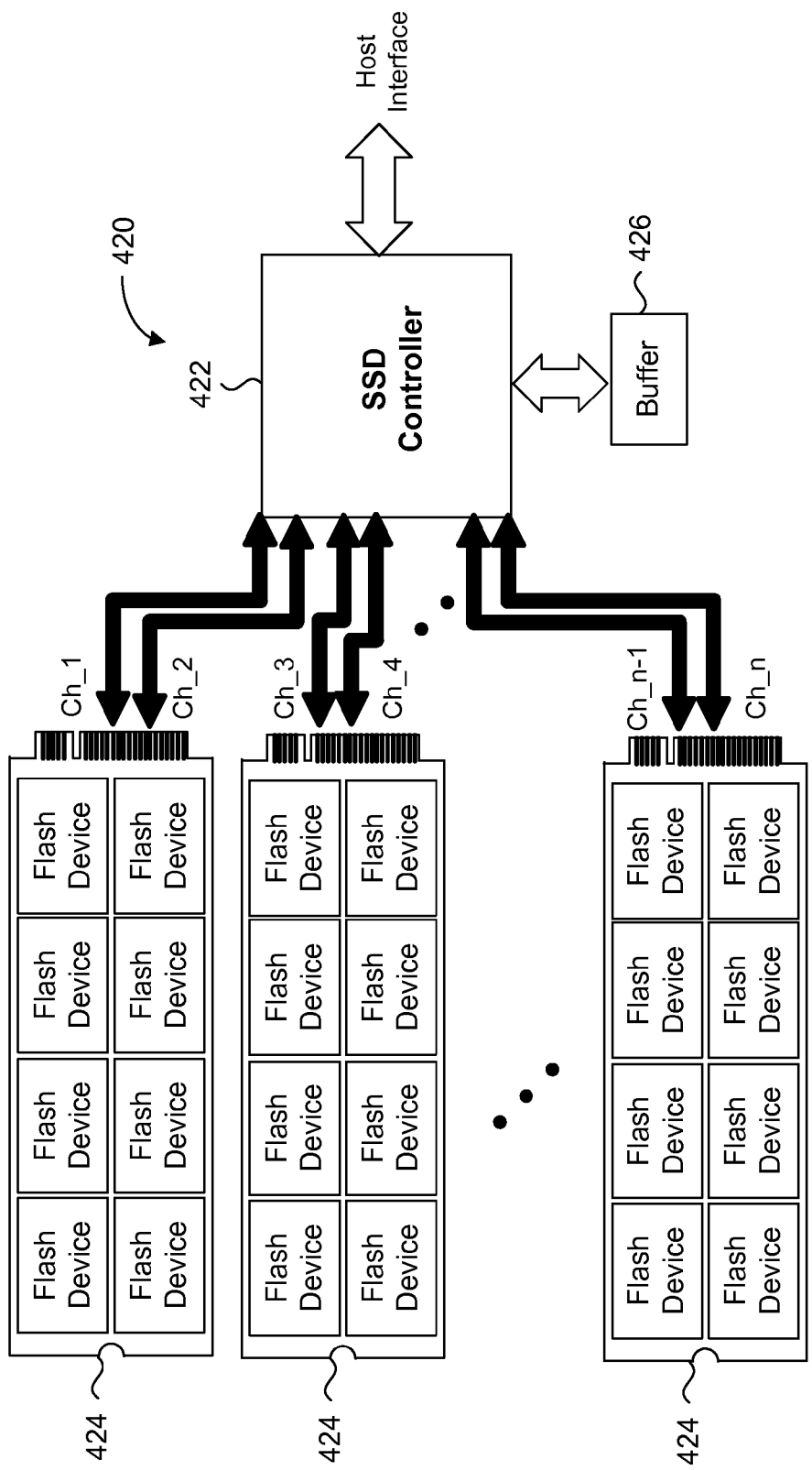
FIG. 14 is a block diagram of an SSD memory system having memory blades with multiple channels, according to a present embodiment.

FIG. 14 is a block diagram of an SSD memory system having skinny type memory blades with multiple channels, according to a present embodiment. In particular, the SSD memory system 420 of FIG. 14 has a memory controller 422 configured to have up to n channels, and can be the same memory controller used in the embodiments of FIG. 12 and FIG. 13. In this alternative embodiment, two channels are connected to each dual channel memory blade 424. Each dual channel memory blade can have the configuration shown in FIG. 11. Buffer memory 426, such as SDRAM memory, is connected to the memory controller 422 for temporary storage of data read from the memory blades 424, or temporary storage of write data to be provided to the memory blades 424, of any channel. The memory controller 422 can include any type of host interface, such as PCIe, SATA, USB or Thunderbolt interfaces, for communicating data to or from the host device. In the presently shown embodiment, the first to fourth channels are annotated as "Ch_1", "Ch_2", "Ch_3" and "Ch_4". The last channel is annotated as "Ch_n" and the second last channel is annotated as "Ch_n-1". Each of these channels is depicted with a bidirectional line, representing the presence of both Sout and Sin lines for the channel.

It should be noted that each memory blade can have memory devices arranged to form more than two channels, each being connected to a channel of the memory controller 422.

The SSD memory system embodiments of FIGS. 12, 13 and 14 illustrate different possible example configurations of an SSD memory system. In each of these embodiments, the SSD controller is configured to include at least one data channel, where each data channel has Sin lines for carrying input signals to the serially connected memory devices of the respective channel, and Sout lines for carrying output signals from the serially connected memory devices of the same channel. While the number of channels configured for the SSD controller may be fixed, different physical configurations of memory blades are possible. This allows for flexible SSD memory system design to meet technical/performance requirements. For example, one memory blade can be connected to each channel to maximize performance by distributing bits of data across all the memory blades so that a large amount of data can be written or read concurrently in a single memory write or read cycle. Alternatively, physical form factor requirements may limit the number of memory blades which can be connected. On the other hand, the lack of such physical requirements may allow for any number of memory blades to be serially connected to each channel for large mass storage applications. The SSD memory system of the present embodiments is easily configurable to accommodate performance and/or physical requirements without any significant system design overhead. Following is a description of possible physical configuration embodiments of the previously described SSD memory system embodiments.

Figure 15:
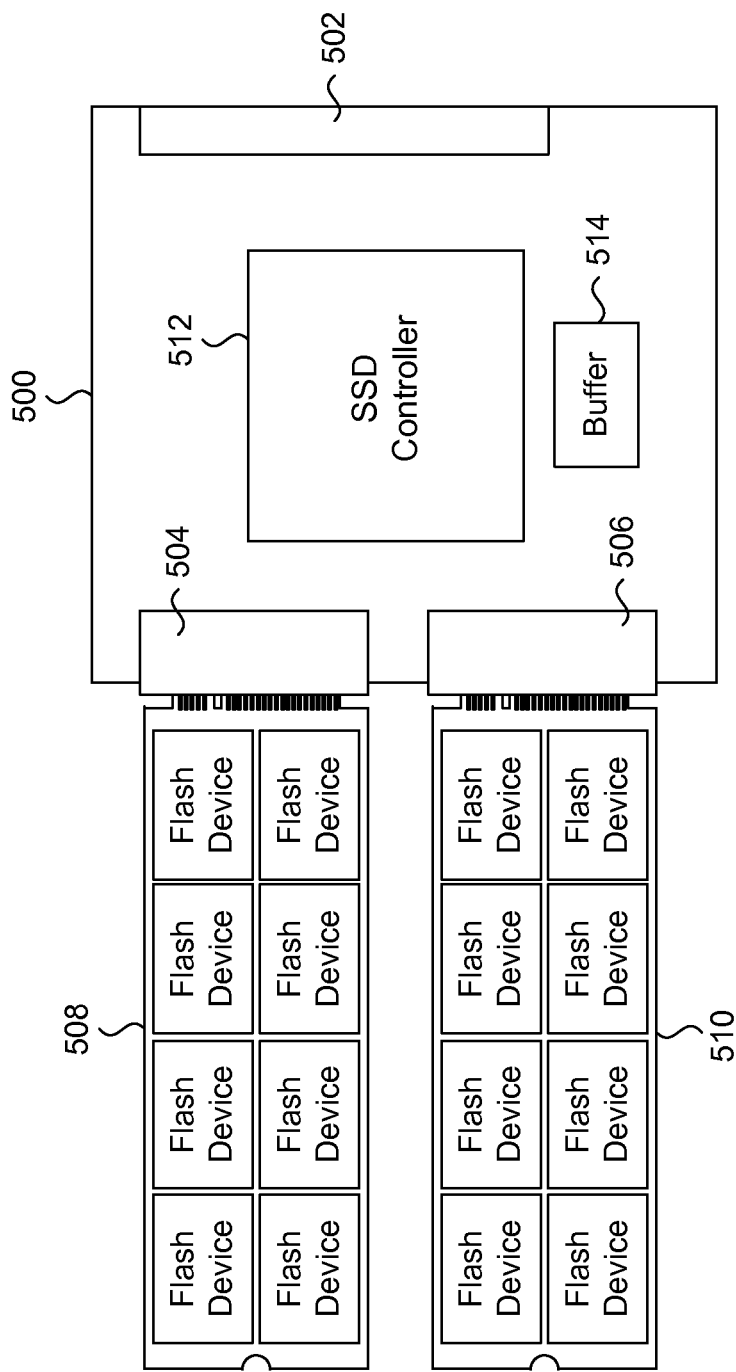
FIG. 15 is a plan view layout diagram of a 2 memory module, 2 channel solid-state hard drive, according to a present embodiment.
Figure 20:
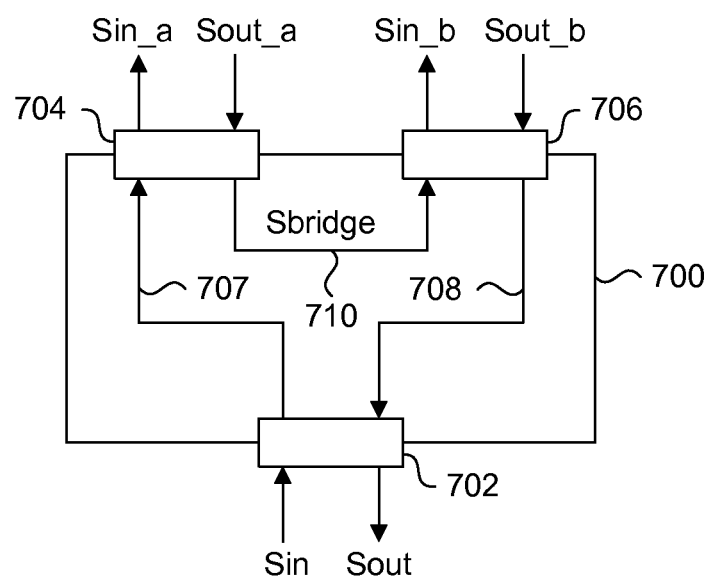
FIG. 20 is a circuit schematic of a dual stack memory blade connector, according to a present embodiment.

FIG. 15 is a plan view layout diagram of a two memory module, two channel SSD, according to a present embodiment. More specifically, FIG. 15 shows the contents of a standardized form factor hard disk drive, such as the 2.5 inch hard disk drive commonly used for laptop computers, computer workstations and servers. FIG. 15 shows a main PCB 500 formed with a host interface 502, and a pair of single slot memory blade connectors 504 and 506 mounted to the main PCB 500. In the present embodiment, the memory blade connectors 504 and 506 are connected on one side and near an edge of the main PCB 500, and the physical interface or connector of each is configured for releasable insertion of a memory blade having a complementary physical interface. Each memory blade connector 504 and 506 has a physical blade interface for electrical connection to a memory blade, a physical PCB interface for electrical connection to the main PCB 500, and internal wiring for connecting the signal lines of the physical blade interface to the physical PCB interface. A circuit schematic of an example memory blade connector is shown in FIG. 20 and will be described below. In the present example of FIG. 15, the physical blade interface is a female type connector configured for receiving a complementary male type connector of a memory blade. Such a physical blade interface of the memory blade connectors 504 and 506 would be shaped and sized to receive the male type connector of the memory blade 504 or 506, and would have electrical conductor leads formed therein in alignment with the electrical conductor leads of the female type connector when the memory blade is inserted in the complementary female socket.

In FIG. 15, memory blades 508 and 510 are shown inserted into respective connectors 504 and 506, and extend away from the PCB, such that they do not overlay any significant portion of the PCB. Furthermore, the memory blades lie in a plane parallel to the main PCB 500. Also mounted to main PCB 500 is an SSD controller 512 and buffer 512, having the same functions as described for the previous embodiments of FIGS. 12, 13 and 14. In the presently shown example, memory blade connector 504 is electrically connected to Sin and Sout signal lines formed on the main PCB 500 for a first channel via its physical PCB interface, while memory blade connector 506 is electrically connected to Sin and Sout signal lines formed on the main PCB 500 for a second channel via its physical PCB interface. Through the internal wiring of the memory blade connector 504 (or 506), the Sin signal lines of the main PCB 500 are electrically coupled to the first memory device of the memory blade, and the Sout signal lines of the main PCB 500 are electrically coupled to the last memory device of the memory blade.

The host interface can be, for example, a SATA interface such as SATA2 or SATA3, but any type of host interface can be used provided a matching memory controller is also used. It is noted that the SSD controller 512 is positioned between the host interface 502 and the memory blade connectors 504 and 506. This is to minimize PCB wiring line lengths between the SSD controller 512 and the memory blade connectors 504 and 506, between the SSD controller 512 and the host interface 502. The dynamic memory buffer can be formed with SDRAM memory or SRAM memory, for example. According to the present embodiments, the SSD controller 512 can be configured to have any number of serial interface channels, each operating with a format compatible with the serial input/output interface of each memory device, such as the input/output interface shown in U.S. Pat. No. 7,652,922. Therefore, the solid-state hard drive of FIG. 15 can be configured to include any number and type of memory blades, as shown by the configurations of FIGS. 13 and 14.

Figure 16:
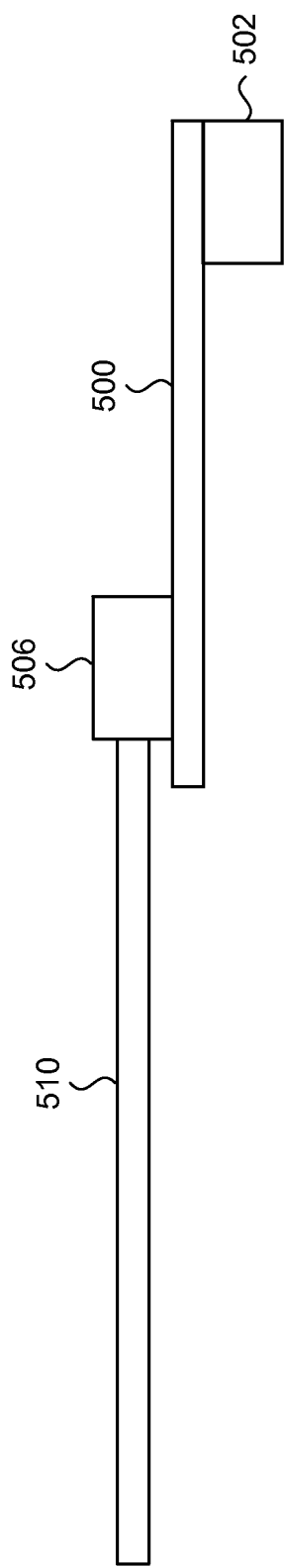
FIG. 16 is a side view of a single-sided partial sized main PCB of an SSD, according to a present embodiment.

FIG. 16 is a simplified side view of the SSD of FIG. 15, according to a present embodiment. The main PCB 500, referred to as a partial sized main PCB, has the host interface connector 502 (i.e. SATA connector) mounted to the bottom right side of the main PCB 500, and a memory blade connector 506 mounted on the top left side of the main PCB 500. A memory blade 510 is shown inserted into the memory blade connector 506. While not shown in FIG. 16, a memory controller is mounted either on the top side or bottom side of the main PCB 500 between the memory blade connector 506 and the host interface connector 502. While not shown in FIG. 16, the other memory blade connector 504 is mounted to the main PCB 500 with memory blade 508 inserted into it. This particular configuration is referred to as a single-sided memory blade configuration, because the memory blade connectors are mounted on one side of the main PCB 500.

Figure 17:
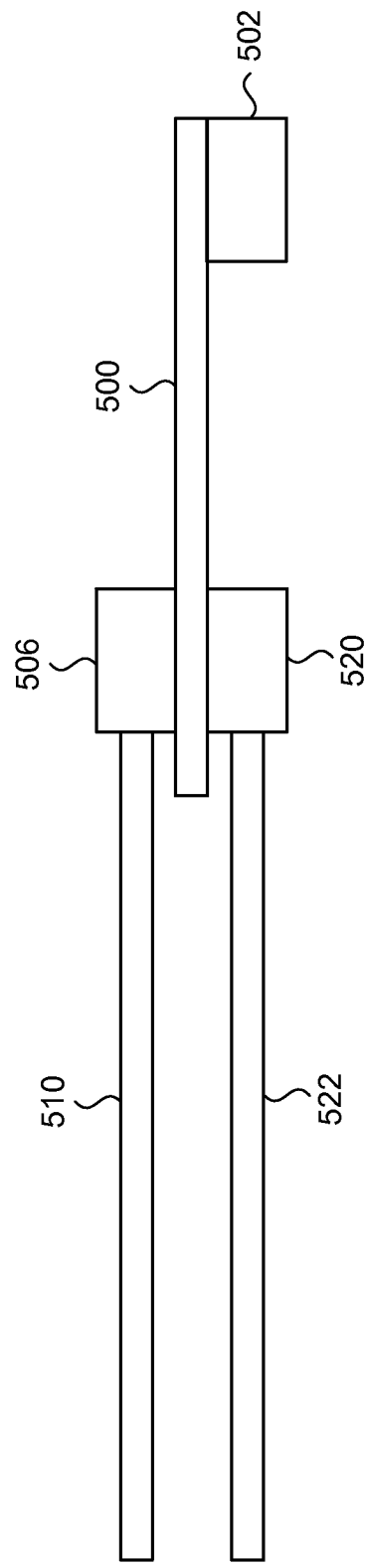
FIG. 17 is a side view of a double-sided partial sized main PCB of an SSD, according to a present embodiment.

FIG. 17 is a side view of a double-sided configuration of the SSD of FIG. 15, according to an alternative embodiment. This embodiment is similar to the embodiment of FIG. 16, except that at least one other memory blade connector 520 is mounted to the bottom side of the main PCB 500, with another memory blade 522 connected thereto. This assumes that the SSD controller has sufficient channels to serve the additional memory blade connector 520 and memory blade 522. With reference to the form of the main PCB 500 shown in FIG. 15 which is configured to have a width sufficient to accommodate two side-by-side memory blade connectors 504 and 506 on one side of main PCB 500, two additional memory blade connectors arranged in the same side-by-side configuration can be mounted to the opposite side of main PCB 500. Therefore, the total storage density of the SDD hard drive is at least doubled. Alternatively, if physical form factor restrictions impose a narrower main PCB 500 having a width that accommodates only a single memory blade connector, then a second memory blade connector can be mounted on the opposite side of the main PCB 500. Therefore, a narrow version of the main PCB 500 can still provide the same overall storage density as the wider version shown in FIG. 15 having only two memory blade connectors mounted on one side of the main PCB 500.

According to alternative embodiments, multiple memory blades can be stacked together and interconnected serially with each other, on one or both sides of the main PCB.

FIG. 18 is a simplified side view of an alternative SSD having a single-sided memory blade configuration, according to a present embodiment. The main components of the SSD include a main PCB 600, a host interface 602, a dual stack memory blade connector 606, and memory blades 608 and 610. This embodiment is similar to the embodiment of FIG. 16, except that a dual stack memory blade connector 606 is used instead of a single memory blade connector 506. The dual stack memory blade connector 606 is shaped and configured to receive the two memory blades 608 and 610, thereby obviating the need for two separate single memory blade connectors. In one possible configuration, the internal wiring of the dual stack memory blade connector 606 is configured to serially connect memory blades 608 and 610 to each other for one channel, as shown in the embodiment of FIG. 13. In another possible configuration, the internal wiring of the dual stack memory blade connector 606 is configured to receive two channels such that each of the two memory blades is connected to one of the two channels. In yet another possible configuration, the internal wiring of the dual stack memory blade connector 606 is configured two receive four channels, where each memory blade is configured to receive two channels, such as in the embodiment shown in FIG. 14. If the main PCB 600 is sized to have a width sufficient to accommodate two dual stack memory blade connectors side-by-side, then up to four memory blades can be used. The dual stack memory blade connectors can be used in a double sided configuration as well.

FIG. 19 is a simplified side view of an alternative SSD having a double-sided memory blade configuration, according to a present embodiment. The same components as those shown in FIG. 18 are present in the embodiment of FIG. 19, except that an additional dual stack memory blade connector 612, with inserted additional memory blades 614 and 616, is mounted to the opposite side of main PCB 600. The same variants and alternative configurations described for the previous embodiments apply to the SSD of FIG. 19.

As previously mentioned, the dual stack memory blade connectors shown in FIGS. 18 and 19 can have different internal wiring configurations, depending on how the memory blades are to be connected to the channel or channels of the SSD controller, and/or the number of channels each memory blade is configured to have. FIG. 20 is an example illustration of the internal wiring for a dual stack memory blade connector configured for serial interconnection of two memory blades to a single channel.

The dual stack memory blade connector 700 includes a PCB interface 702, a first memory blade interface 704 and a second memory blade interface 706. The PCB interface 702 includes pins that are connected to wiring lines of a PCB, while each of the memory blade interfaces 704 and 706 includes pins that are connectable to the corresponding signal line pins of a memory blade, which are also connected to the pins of the PCB interface 702 via internal wiring 707. Input signals for the channel are provided to the PCB interface 702 through the Sin input port, which collectively includes all the input signals of the channel. These signals are routed to the first memory blade interface 704 and provided to the first memory blade as Sin_a. The output of the first memory blade is provided as Sout_a to the first memory blade interface 704. Bridge wiring 710, referred to as Sbridge, couples Sout_a to the second memory blade interface 706, which is provided to the second memory blade as Sin_b. The output of the second memory blade is provided as Sout_b to the second memory blade interface 706, which is coupled to the PCB interface 702 via internal wiring 708. The output signals are provided from the PCB interface 702 through the Sout output port, which collectively includes all the output signals of the channel. In the present embodiment of FIG. 20, any memory blade interface that is not used, meaning that no memory blade is inserted therein, will have a closed loop connector, such as a jumper or loop back module inserted instead. This jumper bridges the Sin_a or Sin_b ports to the Sout_a or Sout_b ports respectively, for continuing the serial channel. Similarly, the loop back module includes signal traces for bridging the Sin_a or Sin_b ports to the Sout_a or Sout_b ports respectively.

In the alternative configuration of the dual stack memory blade connector that receives two channels, the illustration of FIG. 20 is modified such that Sin and Sout for a first channel and a second channel are received at PCB interface 702. Through internal wiring, the Sin and Sout ports for the first channel are coupled to the first memory blade interface 704 and the Sin and Sout ports for the second channel are coupled to the second memory blade interface 706.

The previously described embodiments of the SSD shown in FIGS. 15, 16, 17, 18 and 19 are based on a main PCB that is minimally sized to receive a host connector, an SSD controller, a buffer and memory blade connectors. This type of main PCB is referred to as a partial sized main PCB, since its length dimension (from host connector to memory blade connectors) does not extend the full length of a standard hard disk drive housing, such as a standard 2.5 inch hard disk drive housing. Each of the memory blade connectors is placed as close as possible to the SSD controller in order to minimize the length of signal traces on the main PCB. The advantage of the serial channel is that any number of memory devices can be serially connected to it. Therefore, the total memory capacity for a single memory channel in the 2.5 inch hard disk drive application is limited by the total number of memory devices which can fit within the housing. Hence, by placing the memory blade connectors as close as possible to the host interface connector, each memory blade can be constructed to have a length and width for maximizing the number of memory devices which can be mounted to it, provided that when it is connected to the memory blade connectors the complete assembly fits within 2.5 inch hard disk drive housing. These principles apply equally to any standard hard disk drive housing, or any customized hard disk drive housing.

According to an alternative embodiment of the SSD, a full-sized main PCB can be used instead of a partial sized PCB.

Figure 21:
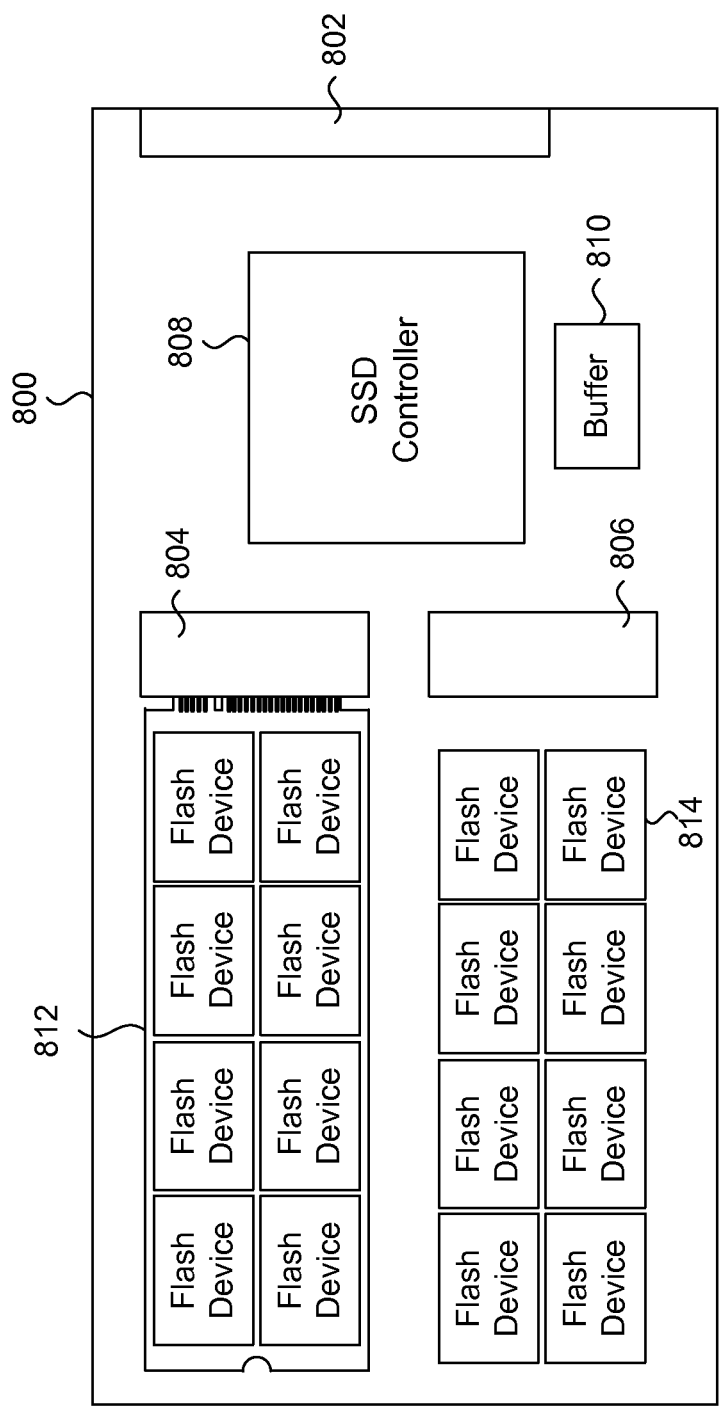
FIG. 21 is a plan view layout diagram of a full-sized main PCB of an SSD, according to a present embodiment.

FIG. 21 is a plan view layout diagram of a two memory module, two channel SSD, according to a present embodiment. This embodiment for the SSD is similar to the one shown in FIG. 15, except that instead of a partial sized main PCB, a full-sized main PCB is used. The embodiment of FIG. 21 shows the contents of a standardized form factor hard disk drive, such as the 2.5 inch hard disk drive commonly used for laptop computers, computer workstations and servers. The SSD of FIG. 21 includes a main PCB 800 formed with a host interface 802, and a pair of memory blade connectors 804 and 806 mounted to the main PCB 800. In the present embodiment, the memory blade connectors 804 and 806 are connected on one side of the main PCB 800, and the physical interface or connector of each is configured for releasable insertion of a memory blade having a complementary physical interface. Memory blade connectors 804 and 806 can be the same as those shown in the previous embodiments. Also mounted to main PCB 800 is an SSD controller 808 and buffer 810, having the same functions as described for the previous embodiments of FIGS. 12, 13 and 14.

In the embodiment of FIG. 21, the memory blade connectors 804 and 806 can be sized and shaped to elevate an inserted memory blade above the surface of the main PCB 800. The purpose of this elevation is to provide clearance for any packaged devices mounted to main PCB 800. In the present example, only one memory blade 812 is shown releasably connected to memory blade connector 804 in order to show the region of the main PCB 800 that would otherwise be hidden in the plan view when a memory blade is inserted into connector 806. In the present embodiment, these packaged devices are permanently mounted memory devices 814, that are serially connected with each other and with a channel of the SSD controller. A group of eight memory devices 814 is shown in the present example, but any number of serially connected memory devices 814 can be used. Accordingly, there can be additional memory devices permanently mounted to main PCB 800 at the region underneath memory blade 812. Therefore, in addition to the two channels, each dedicated to a respective memory blade connected to memory blade connectors 804 and 806, two additional sets of serially connected memory devices 814 can be connected to additional respective channels. Accordingly, the total memory capacity of this SSD embodiment is increased over the embodiment of FIG. 15.

While the embodiment of FIG. 21 shows single slot memory blade connectors 804 and 806 mounted to one side of main PCB 800, at least one additional single slot memory blade connector can be mounted to the opposite side of main PCB 800, similarly to the embodiment of FIG. 17. Similarly to the embodiments shown in FIGS. 18 and 19, dual stack memory blade connectors sized and shaped to elevate the memory blade closest to the surface of the main PCB 700 can be used instead of the single slot memory blade connectors 804 or 806.

The SSD embodiment of FIG. 21 takes advantage of the additional area provided by main PCB 700 by adding further memory devices to increase the memory capacity of the SSD. According to a further alternative embodiment, additional memory blade connectors can be included for stacking additional memory blades over the SSD controller, or other areas of the main PCB.

Figure 22:
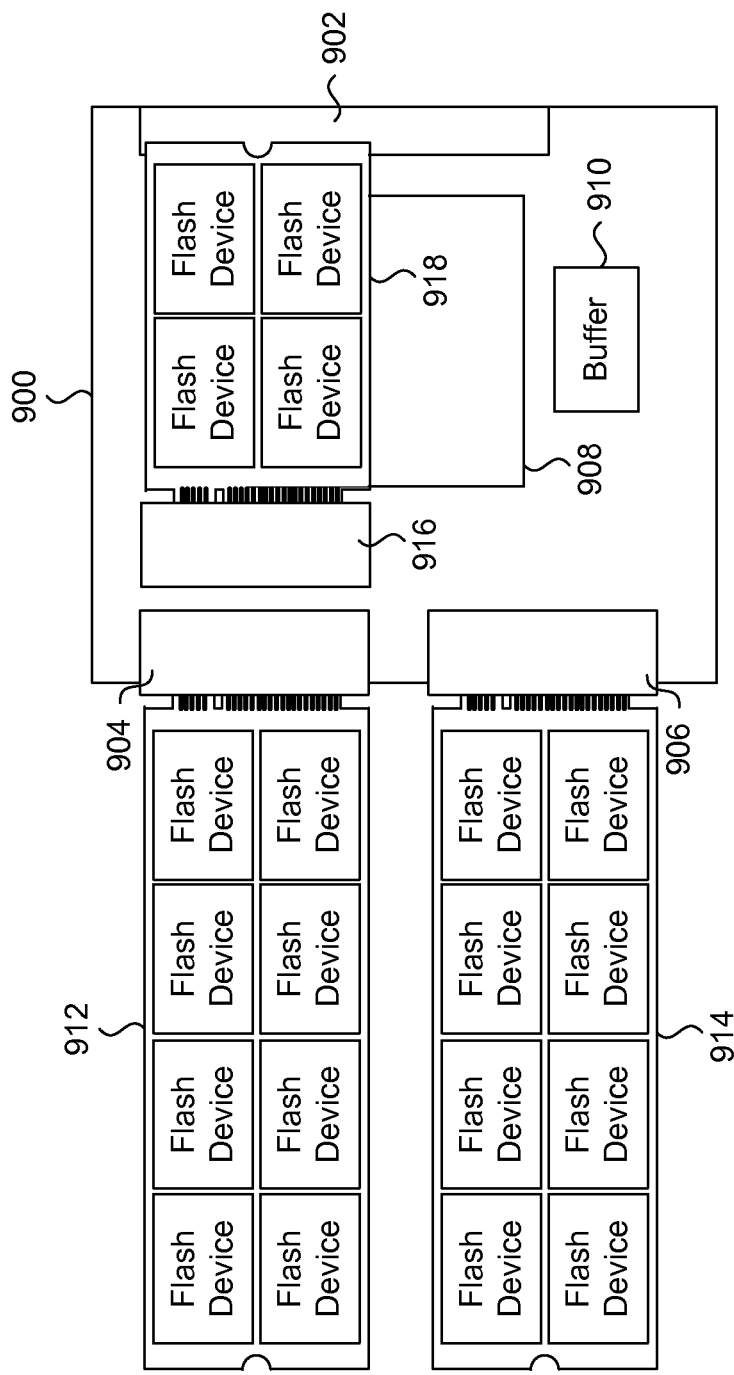
FIG. 22 is a plan view layout diagram of the partial sized main PCB of FIG. 15 with an additional memory blade arranged over the main PCB, according to a present embodiment.

FIG. 22 is a plan view layout diagram of a three memory module, three channel SSD, according to a present embodiment. The SSD of FIG. 22 includes a partial main PCB 900 having a host interface 902, memory blade connectors 904 and 906, an SSD controller 908 a buffer 910, and memory blades 912 and 914, similarly to the SSD embodiment of FIG. 15. The difference with the embodiment of FIG. 22 is the inclusion of memory blade connector 916 positioned back-to-back relative to memory blade connector 904, having a memory blade 918 releasably connected thereto. Memory blade connector 916 is shaped and sized to elevate memory blade 918 over SSD controller 908. It is noted for the present example that memory blade 918 includes four memory devices on one side, and can include an additional four memory devices on the opposite side, where all eight memory devices can be serially connected with each other. In this embodiment, memory blade connector 916 and memory blade 918 are connected to a third channel of SSD controller 908. Alternatively, memory blade connector 916 and memory blade 918 can be configured for serial interconnection with either memory blades 912 or 914, thereby using only two channels of the SSD controller 908. One advantage of using fewer channels is a reduction in power consumption. In the example shown in FIG. 22, the two connectors can be laterally offset from each other and not necessarily flush with each other. Furthermore, a fourth memory blade connector can optionally be mounted to main PCB 900 back-to-back with memory blade connector 906.

Figure 23:
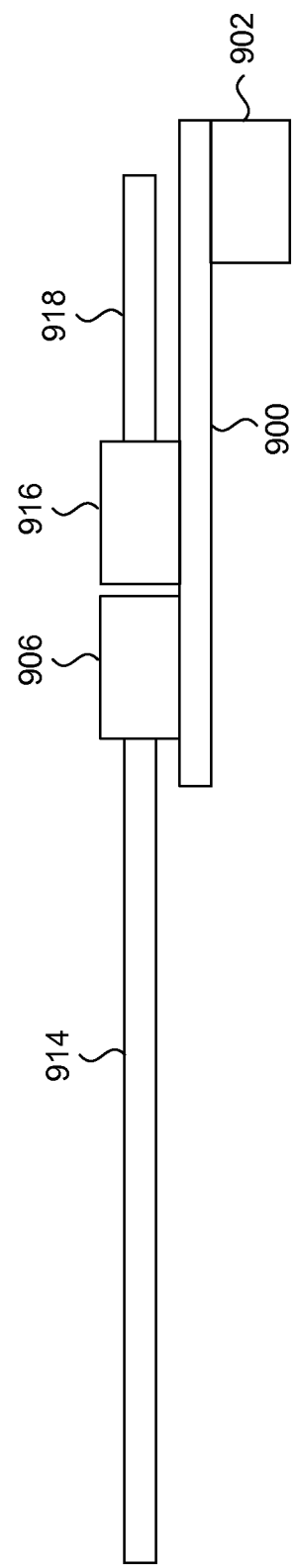
FIG. 23 is a side view of the partial sized main PCB of FIG. 22, according to a present embodiment.

FIG. 23 is a side view of the SSD embodiment of FIG. 22. The same features are annotated with the same reference numbers. The back-to-back arrangement of memory blade connectors 906 and 916 is shown again, such that the female sockets for both connectors face away from each other, thereby facilitating removal or insertion of either memory blades 914 or 918. The memory blade 918 can be sized in any manner to ensure that it fits within the SSD housing. Therefore, the maximum amount of volume within the hard drive housing can be used to contribute to the overall storage capacity of the SSD. Once again, the memory blade connectors can be mounted on both sides of main PCB 900, and dual stack memory blade connectors can be used. Storage capacity of the SSD of FIG. 23 can be further increased by using a full-sized main PCB with additional memory devices permanently mounted thereon, as shown in the embodiment of FIG. 21.

Figure 24:
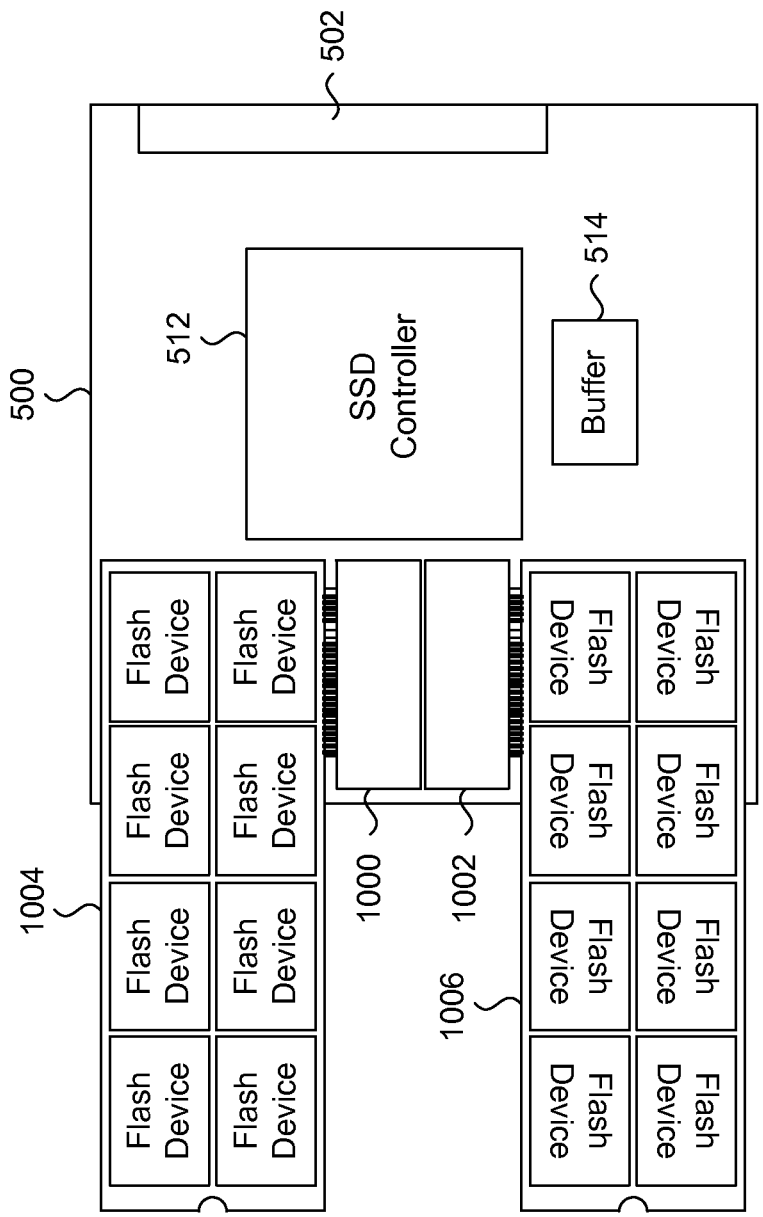
FIG. 24 is a plan view of a partial sized main PCB of an SSD with an alternative memory blade configuration and memory blade connector arrangement, according to a present embodiment.

The previously shown embodiments illustrate memory blade connectors mounted to either side of a partial sized or full-sized main PCB, and oriented in a particular direction. More specifically, the previously shown memory blade connectors have their sockets for receiving memory blades oriented to face away from the host connector. In alternative embodiments, the memory blade connectors can be oriented in any direction while the memory blade shape and/or physical interface orientation is adjusted to accommodate the memory blade connector orientation and the shape of the SSD housing. FIG. 24 is a plan view layout diagram of the SSD of FIG. 15, with modified memory blade connector orientation. In this embodiment, many of the same features as shown in the embodiment of FIG. 15 are shown with the same reference numbers. However, memory blade connector 1000 and 1002 are arranged back-to-back with each other such that their sockets face a direction orthogonal to the host connector 502. In this embodiment, the memory blades 1004 and 1006 are configured to have their connector tabs extend from the long edge of the memory blade PCB. The SSD embodiment of FIG. 24 can be modified to include any one or more of the previously shown SSD variants.

As previously discussed, the presently shown SSD embodiments are intended to replace currently known hard disk drives. Because the computer industry has standardized the form factor for 3.5 and 2.5 inch hard disk drives, the previously shown SSD drive components are designed and configured to fit within the housing of these standardized hard disk drives.

Figure 25:
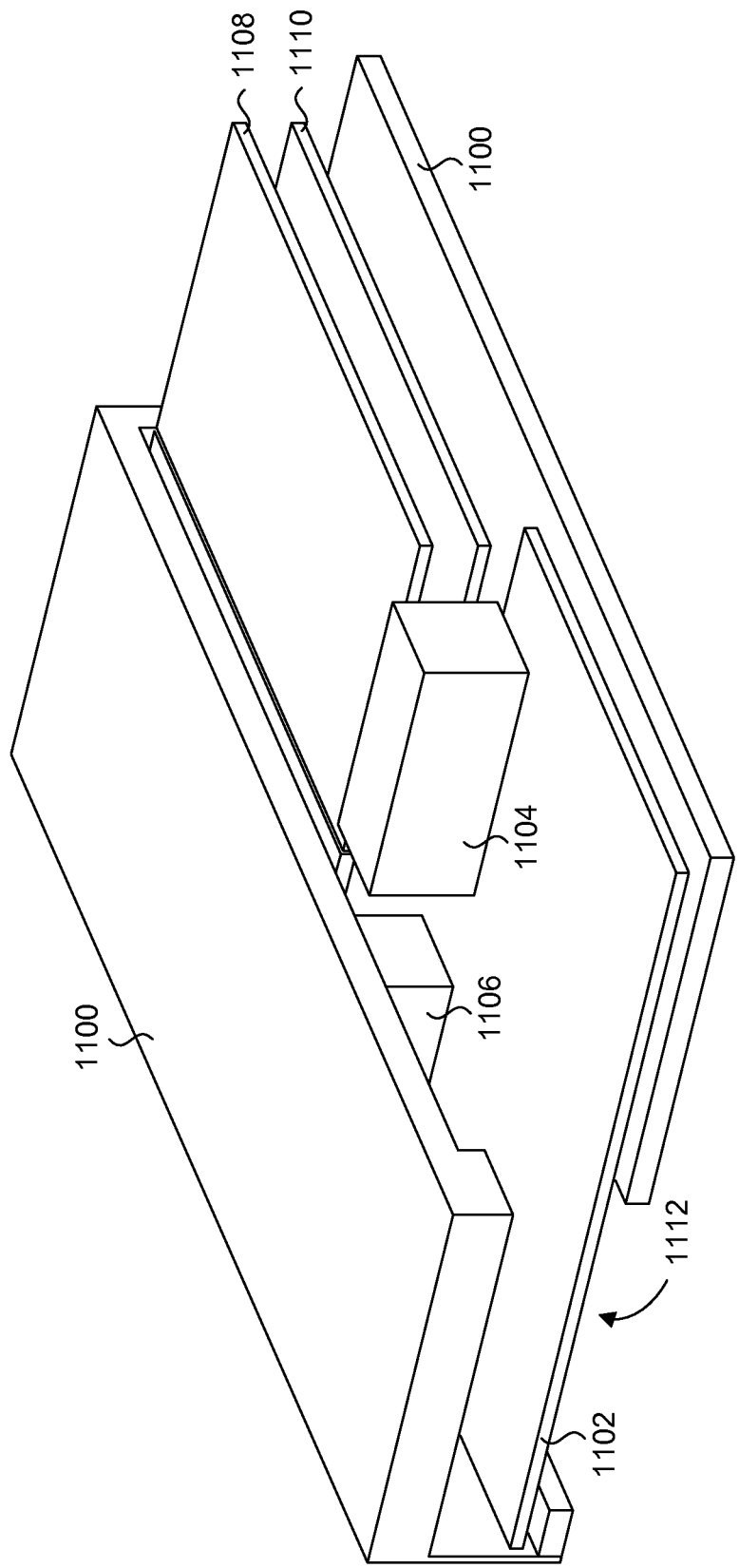
FIG. 25 is a top perspective cutaway view of a single-sided partial sized main PCB within a solid-state drive housing, according to a present embodiment.

FIG. 25 is a top perspective cutaway view of a standardized hard disk drive housing containing a single-sided partial sized main PCB SSD, similar to the SSD of FIG. 15. This standardized hard disk drive includes a housing 1100 dimensioned in width, length and height to comply with a particular hard disk drive housing standard, such as the 3.5 or 2.5 inch hard disk drive housing standards. Fitting within the housing 1100 is partial sized main PCB 1102 and dual stack memory blade connectors 1104 and 1106. Two memory blades 1108 and 1110 are inserted into respective sockets of memory blade connector 1104. While not shown in FIG. 25, two memory blades are inserted into respective sockets of memory blade connector 1106. In this example, the housing 1100 may include a cut-out region 1112 to accommodate a host interface (not shown).

In this particular embodiment, the housing is a 3.5 inch hard disk drive housing. It can be clearly seen that the partial sized main PCB in combination with the memory blades inserted into the dual stack memory blade connectors can fit within the housing of the 3.5 inch hard disk drive form factor. In one example, each memory blade can have a capacity of 500 GB. If each of the four channels is connected to one memory blade of 500 GB capacity, then the total storage capacity for the 3.5 inch solid-state hard disk drive is 2 TB. The use of a full-sized main PCB and additional memory blade connectors as shown in the previous embodiments can further increase the total storage capacity of this SSD.

Several advantages are obtained with the current SSD embodiments. No hermetic sealing of the housing is required, as is currently required for rotating disk drives, since dust and small particulate matter will not impact reliable operation of the SSD. This will reduce the overall cost to manufacture the SSD. The memory blades are releasably connected to the memory blade connectors, therefore they can be replaced with new memory blades in the event of failure. The total storage density of the SSD is user upgradable when higher density memory blades become available. The SSD housing and memory blades can be sold separately, thereby allowing users to balance their storage requirements with cost. Another advantage of the previously shown embodiments is that only one SSD controller is required for interfacing between the memory blades and the host interface. Accordingly, reduced cost and system complexity is realized with the embodiments of FIGS. 15 to 25.

Further advantages are realized by the manufacturer to further reduce costs. The flexibility in system configuration permits the manufacturer to configure the SSD system based on any specific customer request without having to resort to producing various fixed SSD systems having different storage capacities. This results in a reduction in inventory storage overhead since there is no longer any need to carry various fixed SSD systems with different storage capacities, as any SSD system based on the presently described embodiments can be produced by any downstream manufacturer or retailer having the previously described memory blades and solid-state drive housings. In addition to the aforementioned cost reduction advantages afforded by the presently described SSD system embodiments, the signal integrity (SI) is superior to traditional SSD systems, due to the isolated channel environment with module approach. In other words, the signal interference between channels will be greatly reduced relative to traditional SSD architectures.

The previously described arrangements of memory blade connectors, memory blades and SSD controller are not limited to standardized hard disk drive housings. In another embodiment, custom sized SSD enclosures capable of storage capacities larger than the hard disk drive housing based SSD embodiments above are possible. Such SSD enclosures would have the same advantages noted above, and would be portable for use as mobile storage for personal computers and laptops. This can easily be done by using any host interface that is commonly available on personal computers and laptops, such as a USB interface.

The previously described SSD embodiments can be applied to PCI type cards which can be plugged into a corresponding Peripheral Component Interconnect (PCI) slot of a personal computer motherboard, to provide large capacity and high speed operation.

Figure 26:
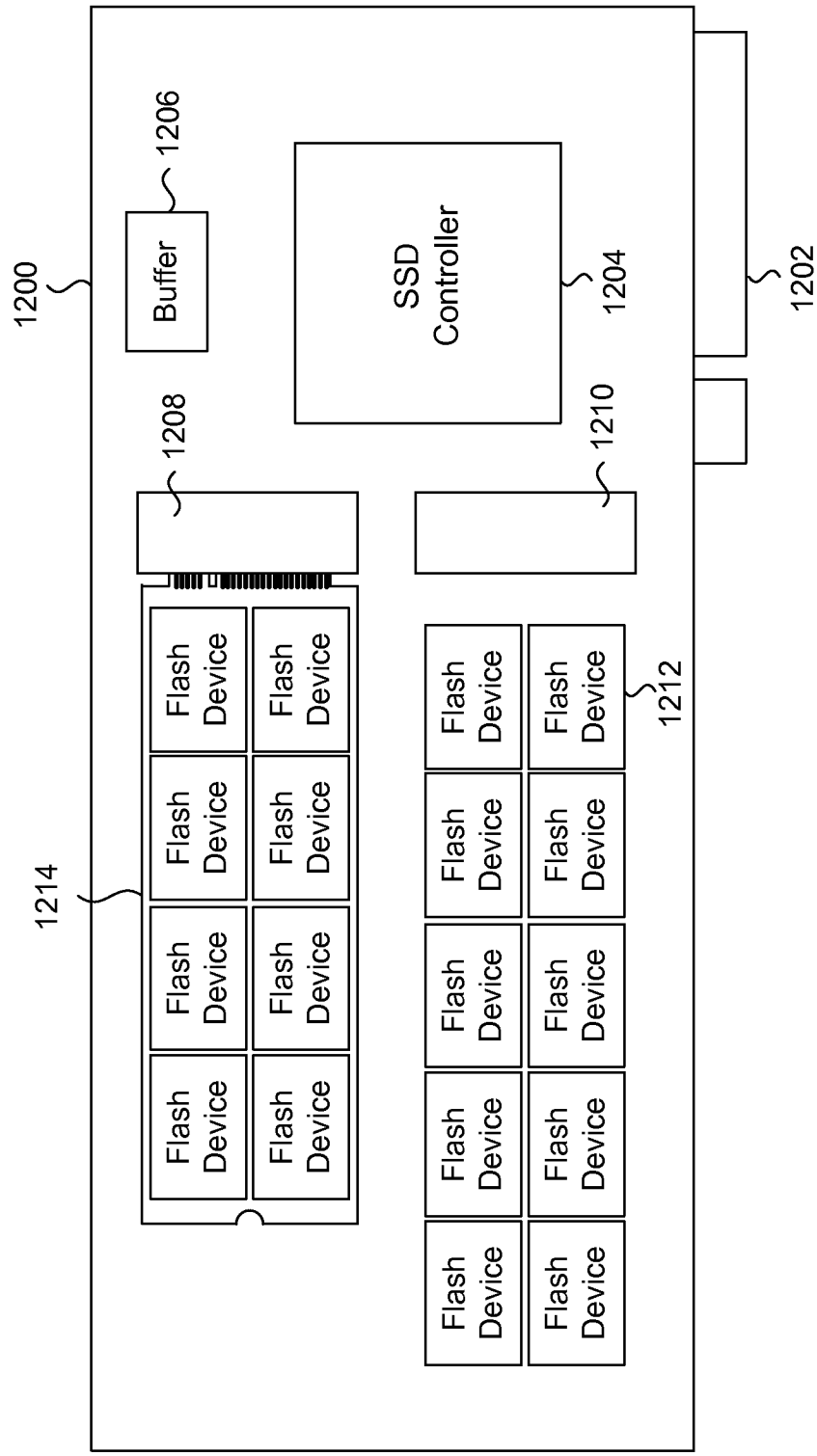
FIG. 26 is a plan view layout diagram of a PCI-type SSD memory card, according to a present embodiment.

FIG. 26 is a plan view layout diagram of a PCI-type SSD, according to a present embodiment. Those skilled in the art understand that most computer motherboards available today have PCI slots for receiving peripheral devices such, as but not limited to, sound cards and video cards. The embodiment of FIG. 26 is similar in componentry to the embodiment of FIG. 21, but it is noted that the PCI card has a larger main PCB area than the previously shown SSD full sized main PCB. In FIG. 26 the PCI type SSD has a main PCB 1200, a PCI type interface 1202, an SSD controller 1204, a buffer 1206, at least two dual stack memory blade connectors 1208 and 1210, and optional memory devices 1212 permanently mounted to main PCB 1200. While not clearly shown in FIG. 26, two memory blades 1214 are releasably connected to respective slots of dual stack memory blade connector 1208. For the sake of viewing the memory devices 1212 mounted to main PCB 1200, dual stack memory blade connector 1210 is shown without memory blades connected to it. While not shown, the opposite side of main PCB 1200 can have additional dual stack memory blade connectors and additional memory devices 1212 mounted thereon. It can be seen that the total storage capacity of such a configured PCI-type SSD can be much greater than the standardized hard drive sized SSD embodiments. Additional storage capacity can be obtained by stacking memory blades over the area of the SSD controller 1204, as shown in the embodiment of FIG. 22.

Once again, all the dual stack memory blade connectors are mounted as close as possible to the SSD controller 1204 in order to minimize signal trace lengths between the SSD controller 1204 and the memory devices, and the SSD controller 1204 is mounted as close as possible to the PCI type interface 1202 in order to minimize those signal trace lengths. For the memory devices 1212, only the first memory device receiving Sin signals and the last memory device in the chain providing Sout signals need to be positioned close to the SSD controller 1204.

All the previously described SSD embodiments are directed to peripheral type SSD storage solutions for computers. Another application for the presently shown embodiments is to directly mount memory blade connectors to a computer motherboard, thereby allowing users to add memory blades either to replace traditional magnetic rotating 2.5 inch or 3.5 inch hard disk drives, or to supplement existing 2.5 inch or 3.5 inch disk drives.

Figure 27:
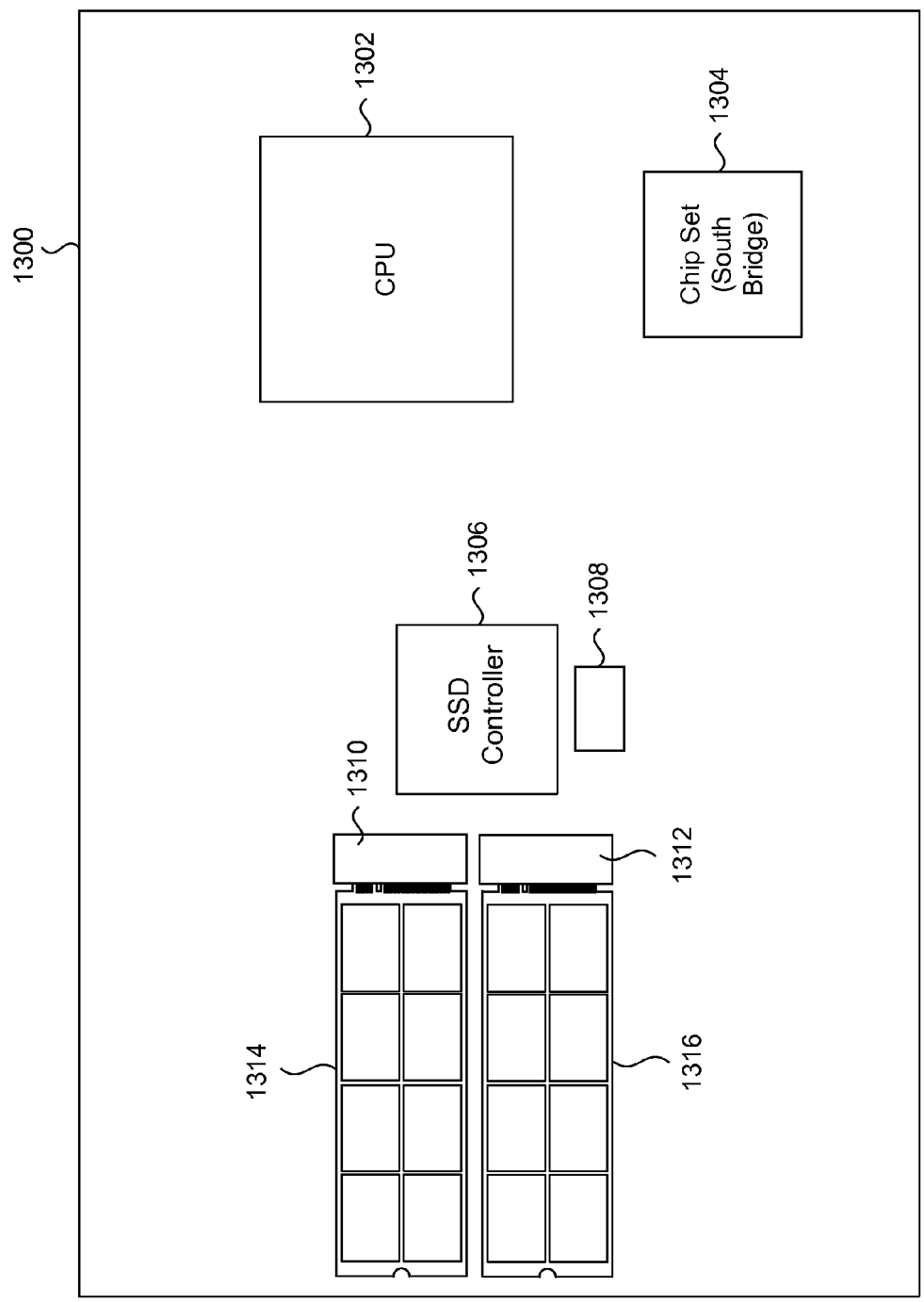
FIG. 27 is a plan view layout diagram of a computer motherboard having integrated memory blade connectors, according to a present embodiment.

FIG. 27 is a plan view layout diagram of a portion of a computer motherboard having an integrated configurable size SSD, according to a present embodiment. The motherboard 1300 includes components such as a central processing unit (CPU) 1302, a matching Southbridge (or equivalent) chipset 1304 for handling or managing the computer I/O functions, and other well known components commonly found on computer motherboards. These are not mentioned here, but those skilled in the art understand that such components are typically required to provide specific functionality in addition to, or in support of, other components of the motherboard. In addition to these well known motherboard components, there is an SSD controller 1306, buffer 1308, and dual stack memory blade connectors 1310 and 1312 for receiving up to four memory blades, two of which are shown in FIG. 27 as memory blades 1314 and 1316. In the present embodiment, the SSD controller 1306 is configured to have the same serial interface channels used in the previously described SSD embodiments for communicating with inserted memory blades, and a host interface for communicating with the Southbridge chipset.

While two dual stack memory blade connectors are shown, single slot memory blade connectors can be used instead to reduce the overall height profile of motherboard 1300. Such a computer motherboard is ideally suited for laptop computers and ultra books. Any number of memory blade connectors can be used, provided the SSD controller has a sufficient number of channels. Even using a limited number of channels, multiple memory blade connectors can be connected serially with each other. The advantage of integrating the configurable size SSD with the motherboard 1300 is the ability to easily replace memory blades, due to unexpected failure or to simply upgrade the overall storage capacity. The present SSD architecture allows for flexible motherboard design, because the memory blade connector footprint is small, and can be oriented in any direction. For example while the memory blade connectors 1310 and 1312 are shown in a side-by-side configuration, both can be positioned at different orientations relative to each other, and/or at different positions on the motherboard 1300, but preferably proximate to the SSD controller 1306.

All the previously described SSD embodiments share the advantage where each memory blade does not include a dedicated memory controller. Therefore, no additional RAIDing is required, thereby avoiding drawbacks associated with RAIDING such as performance degradation of the system from the additional overhead to the operation cycles of the system. This is due to the fact that any number of memory devices and memory blades can be serially connected to each other for a single channel. The serially connected nature of the memory devices on each memory blade greatly simplifies signal routing design, because all the memory devices on a memory blade communicate through a single input/output serial interface without any memory controller. Therefore, the memory blade connectors can be positioned as close as possible to the memory controller. For the main PCB designer, this can greatly simplify design of the main PCB. For example, if half as many channels as prior solid-state drive memory controllers are used to access the same total memory capacity, fewer signal traces are required for the main PCB. Furthermore, placement of the memory blade connectors closer to the memory controller allows for larger sized memory blades for accommodating more memory devices. Also, by stacking the memory blades over the main PCB, additional memory devices can be mounted to the main PCB to further increase the total available storage capacity of the SSD.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

The above-described embodiments are intended to be examples only. Alterations, modifications and variations can be effected to the particular embodiments by those of skill in the art without departing from the scope, which is defined solely by the claims appended hereto.

What is claimed is:

1. A solid-state drive memory system, comprising:
   a memory controller mounted on a printed circuit board (PCB) and having a host interface for providing and receiving host data, and
   a memory interface for providing memory input signals and receiving memory output signals;
   a memory blade having serially connected memory devices, and a connector tab having input ports configured to receive the memory input signals and output ports configured for providing the memory output signals, the memory input signals being received by a first memory device of the serially connected memory devices and the memory output signals being provided by a last memory device of the serially connected memory devices;
   serially connected memory devices permanently mounted to the PCB and in communication with the memory controller; and
   a connector mounted on the PCB and having a socket configured to releasably receive the connector tab of the memory blade and configured for coupling the memory input signals and the memory output signals between the memory blade and the memory controller.

2. The solid-state drive memory system of claim 1, wherein the connector is mounted approximately at an edge of the PCB and the memory blade extends away from the PCB when inserted into the socket of the connector.

3. The solid-state drive memory system of claim 1, wherein the connector is a first connector mounted to a first side of the PCB, and a second connector is mounted to a second side of the PCB for receiving another memory blade.

4. The solid-state drive memory system of claim 1, wherein the socket is a first socket, and the connector includes a second socket configured to releasably receive another memory blade.

5. The solid-state drive memory system of claim 4, wherein the first socket is serially connected to the second socket.

6. The solid-state drive memory system of claim 5, wherein the memory input signals and the memory output signals form a channel of the memory controller.

7. The solid-state drive memory system of claim 4, wherein one set of the memory input signals and the memory output signals form a first channel of the memory controller, and a second set of the memory input signals and the memory output signals form a second channel of the memory controller, the first socket being electrically connected to the first channel, and the second socket being electrically connected to the second channel.

8. The solid-state drive memory system of claim 1, wherein the PCB is sized to fit within a standardized hard disk drive housing.

9. The solid-state drive memory system of claim 8, wherein the connector is mounted on the PCB for positioning the received memory blade over at least one memory device of the serially connected memory devices.

10. The solid-state drive memory system of claim 1, wherein the connector is a first connector, and a second connector is mounted in a side-by-side arrangement with the first connector and having respective sockets facing one direction.

11. The solid-state drive memory system of claim 10, wherein the PCB, the first connector and the second connector are dimensioned to fit within a standard hard disk drive housing.

12. The solid-state drive memory system of claim 1, wherein the connector is a first connector, and a second connector is mounted in a back-to-back arrangement with the first connector for receiving another memory blade.

13. The solid-state drive memory system of claim 1, wherein the memory controller and the connector are mounted on a computer motherboard.

14. The solid-state drive memory system of claim 1, wherein the memory controller and the connector are mounted on a PCI type card insertable into a PCI slot of a computer motherboard.

15. A solid-state memory storage device, comprising:
   a main printed circuit board (PCB) including a host interface connector for receiving input data having a host interface format and for providing output data having the host interface format;

a memory controller mounted to the main PCB for converting the input data into write data having a serial interface format, and for converting received read data having the serial interface format into the output data;

at least one memory module having serially connected memory devices mounted thereon, and releasably connectable to the main PCB for receiving the write data from the memory controller and for providing the read data to the memory controller, and serially connected memory devices permanently mounted to the PCB and in communication with the memory controller.

16. The solid-state memory storage device of claim 15, further including at least one memory module connector mounted to the main PCB shaped for receiving the at least one connector of the memory module.

17. The solid-state memory storage device of claim 16, wherein the main PCB and the at least one memory module are sized and shaped to fit within a hard disk drive housing.

18. The solid-state memory storage device of claim 17, wherein the hard disk drive housing includes a standardized 3.5 inch hard disk drive housing.

19. The solid-state memory storage device of claim 18, wherein the hard disk drive housing includes a standardized 2.5 inch hard disk drive housing.

20. The solid-state memory storage device of claim 19, wherein the main PCB is a PCI type card insertable into a PCI slot of a computer motherboard.

* * * * *